United States Patent
Ishimaru et al.

(10) Patent No.: US 7,180,169 B2
(45) Date of Patent: Feb. 20, 2007

(54) CIRCUIT COMPONENT BUILT-IN MODULE AND METHOD FOR MANUFACTURING THE SAME

(75) Inventors: Yukihiro Ishimaru, Hirakata (JP); Yasuhiro Sugaya, Toyonaka (JP); Toshiyuki Asahi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 142 days.

(21) Appl. No.: 10/926,879

(22) Filed: Aug. 26, 2004

(65) Prior Publication Data

US 2005/0045369 A1   Mar. 3, 2005

(30) Foreign Application Priority Data

Aug. 28, 2003   (JP) .............................. 2003-304974

(51) Int. Cl.
  *H01L 23/48* (2006.01)
(52) U.S. Cl. .................................................... 257/690
(58) Field of Classification Search ........ 257/734–738, 257/678–691, 700–707
See application file for complete search history.

(56) References Cited

U.S. PATENT DOCUMENTS

| | | | | |
|---|---|---|---|---|
| 5,866,953 A | * | 2/1999 | Akram et al. ................ | 257/790 |
| 6,013,948 A | * | 1/2000 | Akram et al. ................ | 257/698 |
| 6,038,133 A | | 3/2000 | Nakatani et al. | |
| 2001/0030059 A1 | | 10/2001 | Sugaya et al. | |
| 2002/0175402 A1 | * | 11/2002 | McCormack et al. ........ | 257/700 |
| 2003/0127725 A1 | * | 7/2003 | Sugaya et al. .............. | 257/700 |

FOREIGN PATENT DOCUMENTS

| | | |
|---|---|---|
| JP | 11-220262 | 8/1999 |
| JP | 2001-244638 | 9/2001 |

* cited by examiner

*Primary Examiner*—Nathan W. Ha
(74) *Attorney, Agent, or Firm*—Hamre, Schumann, Mueller & Larson, P.C.

(57) ABSTRACT

A circuit component built-in module includes the following: an electrical insulating substrate made of a first mixture including a filler and a thermosetting resin; a wiring pattern formed on at least a principal surface of the electrical insulating substrate; circuit components that are arranged inside the electrical insulating substrate and connected electrically to the wiring pattern; and vias for electrically connecting the wiring patterns. At least one of the circuit components is mounted using wires. Part or all of the wires is sealed with a second mixture including a filler and a resin. This circuit component built-in module can eliminate a wire failure or short circuit while using a low cost mounting technique such as wire bonding.

18 Claims, 21 Drawing Sheets

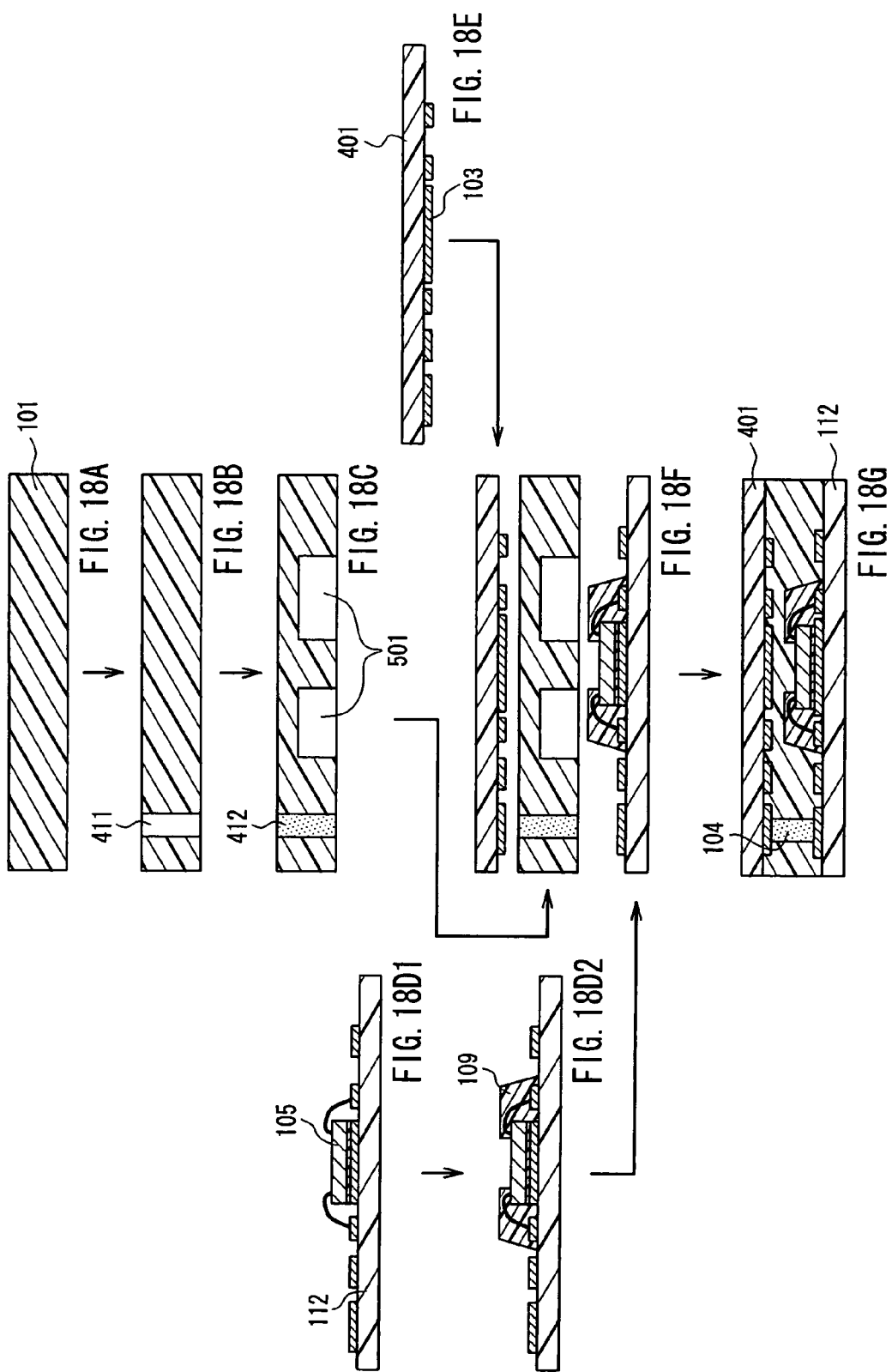

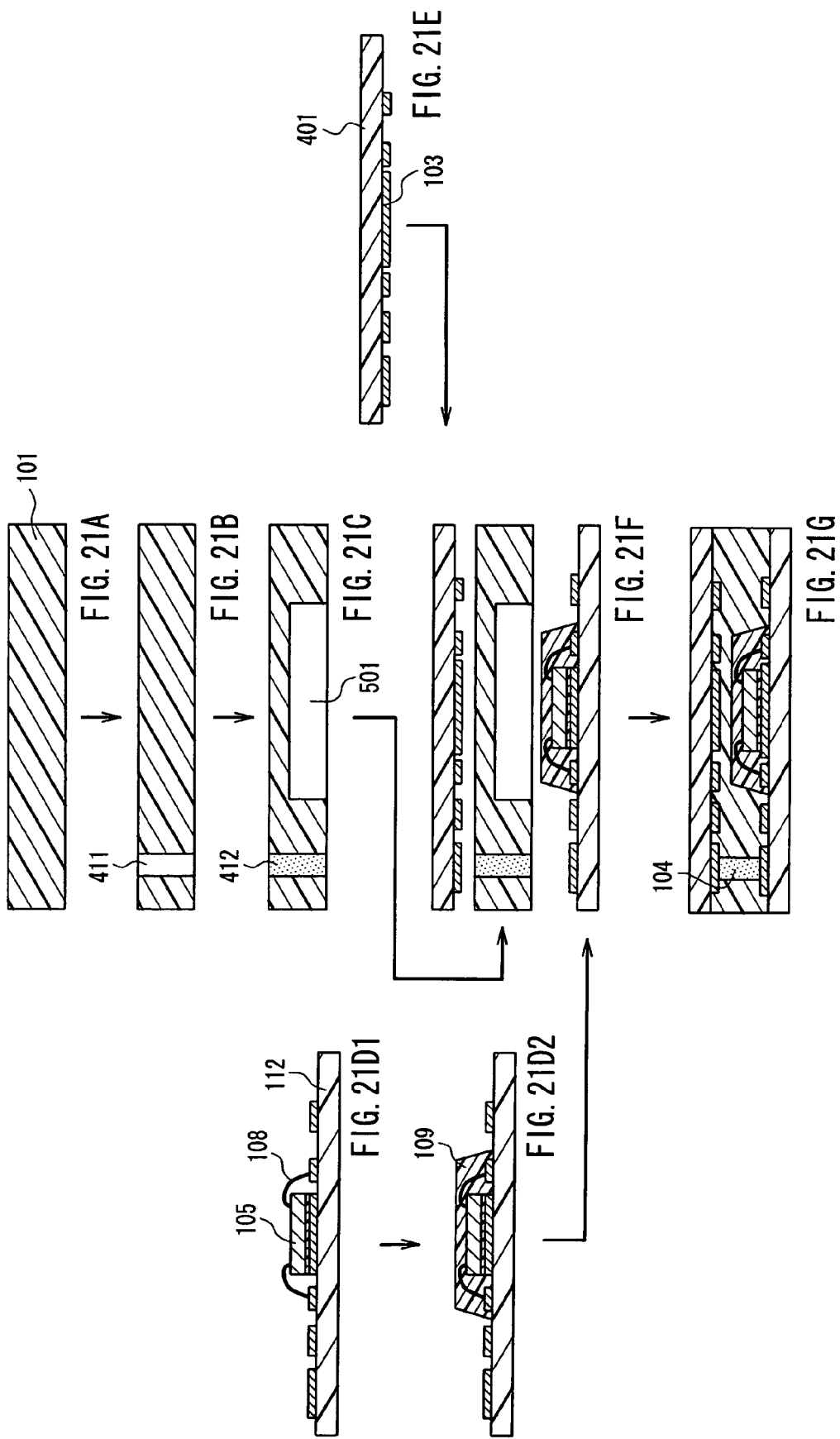

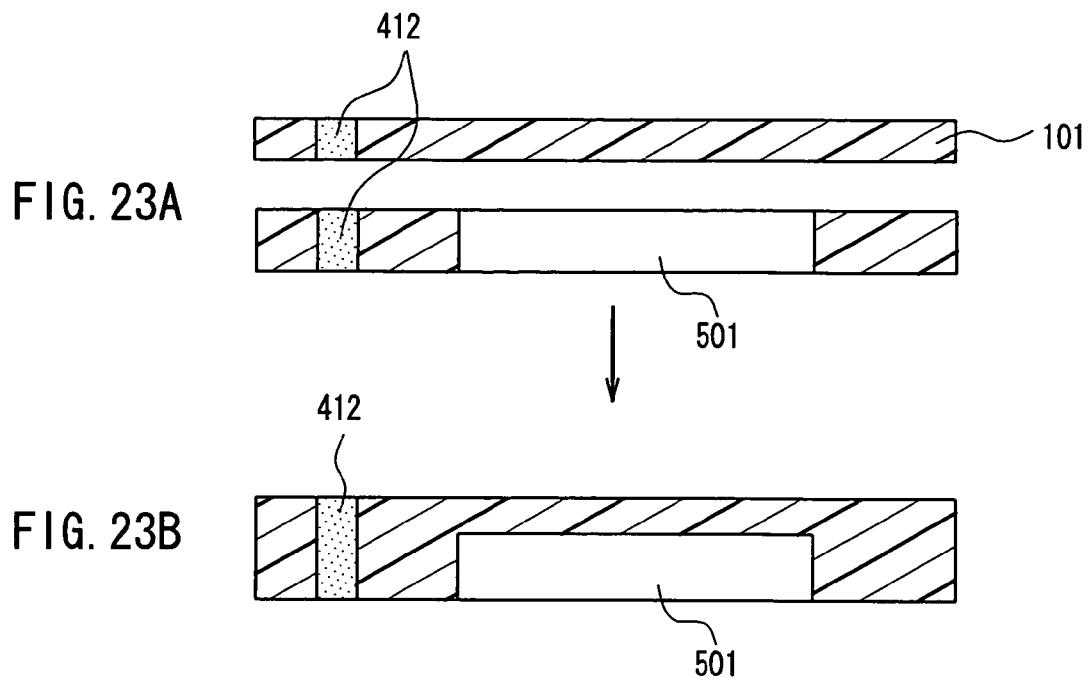
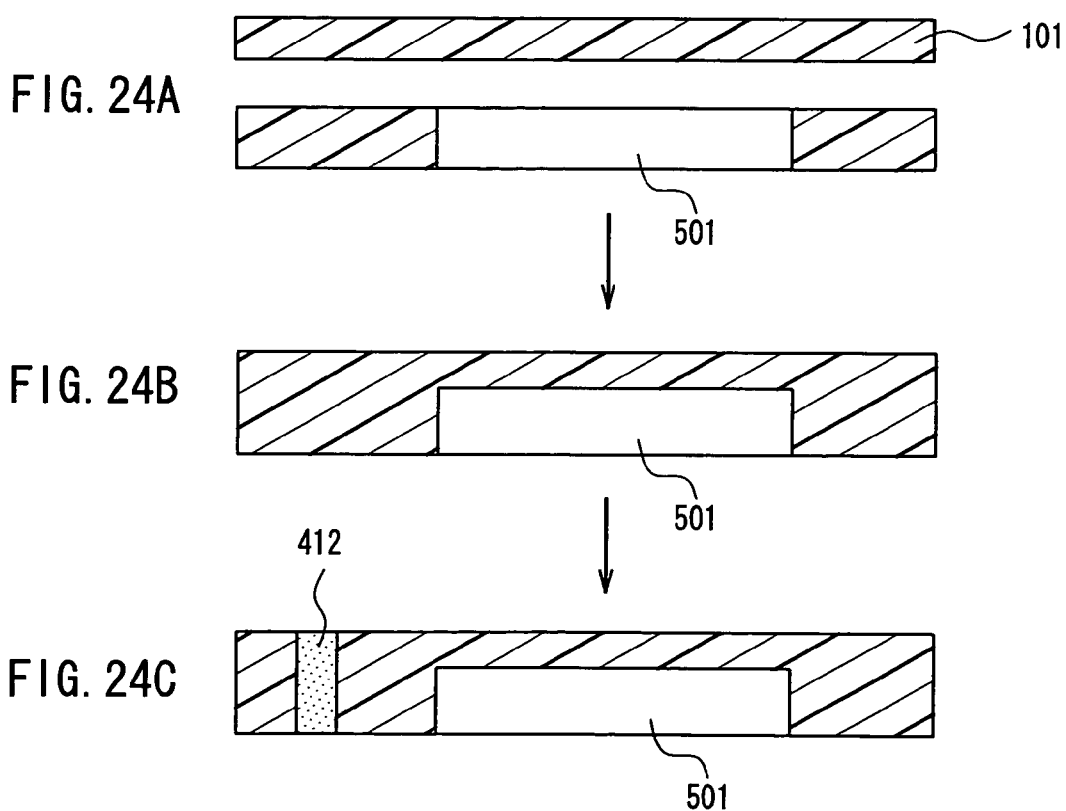

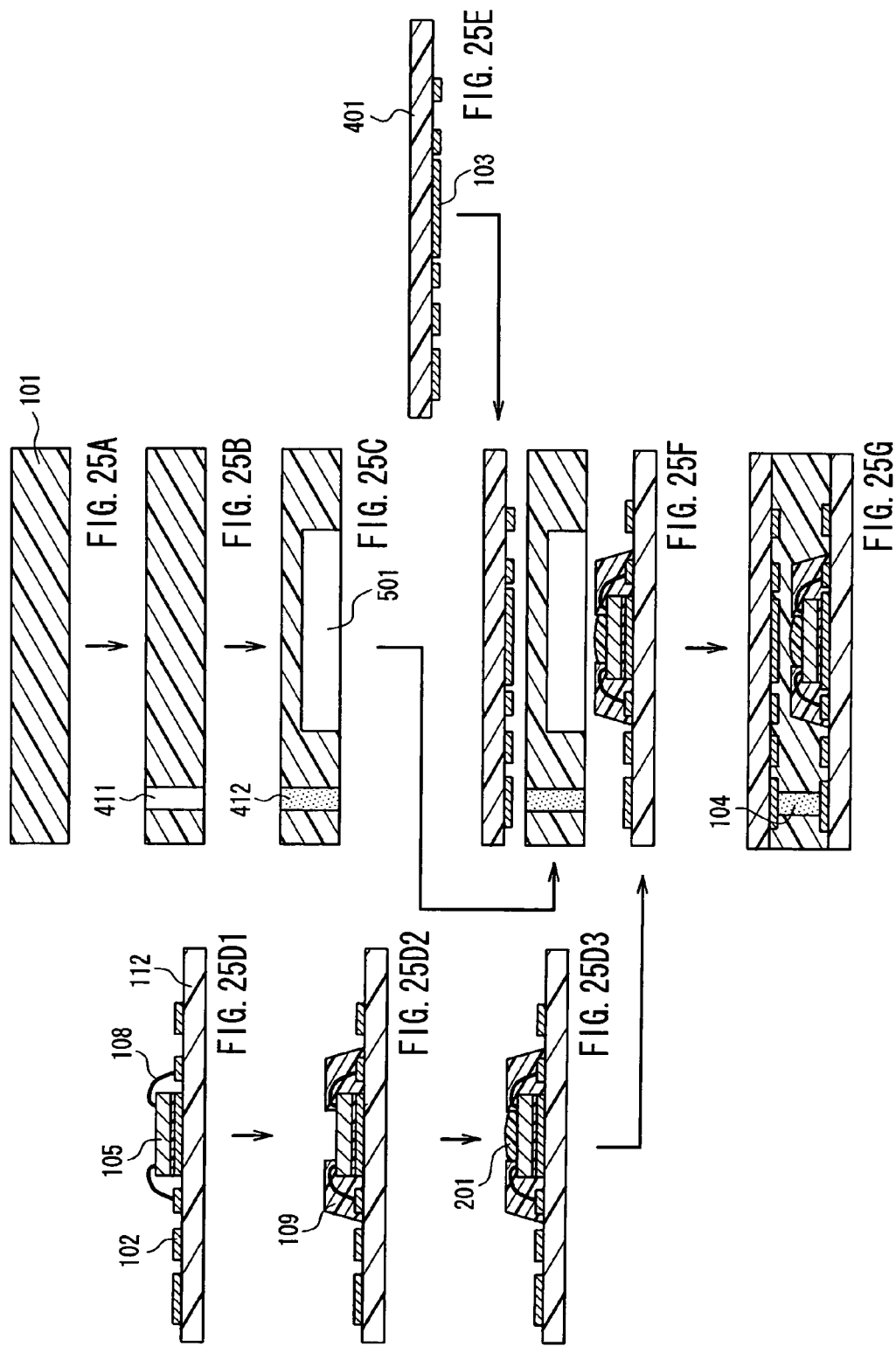

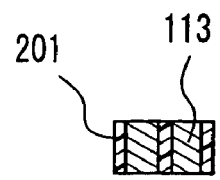
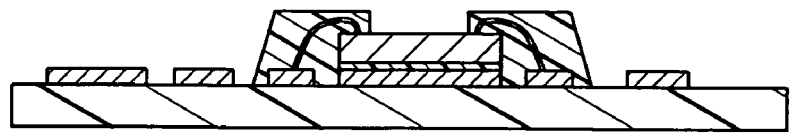
FIG. 27A
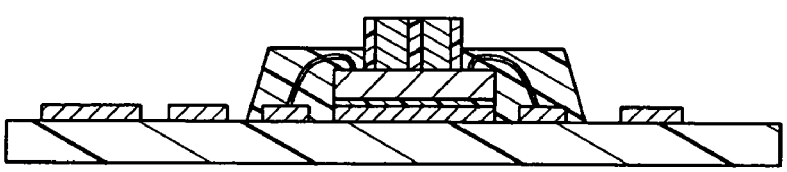
FIG. 27B
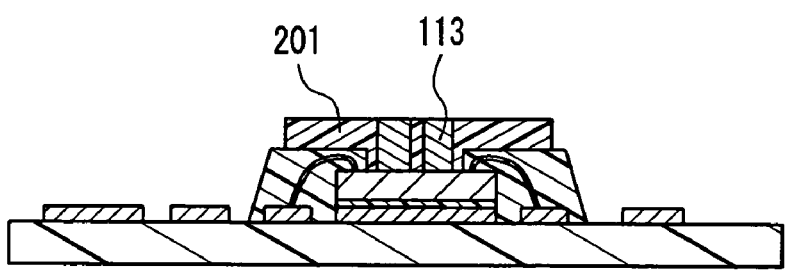
FIG. 27C
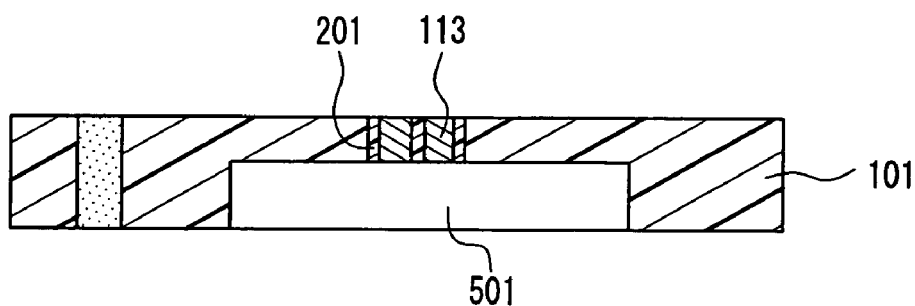
FIG. 28A
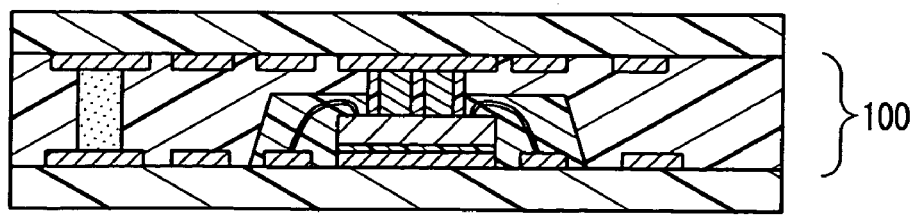
FIG. 28B

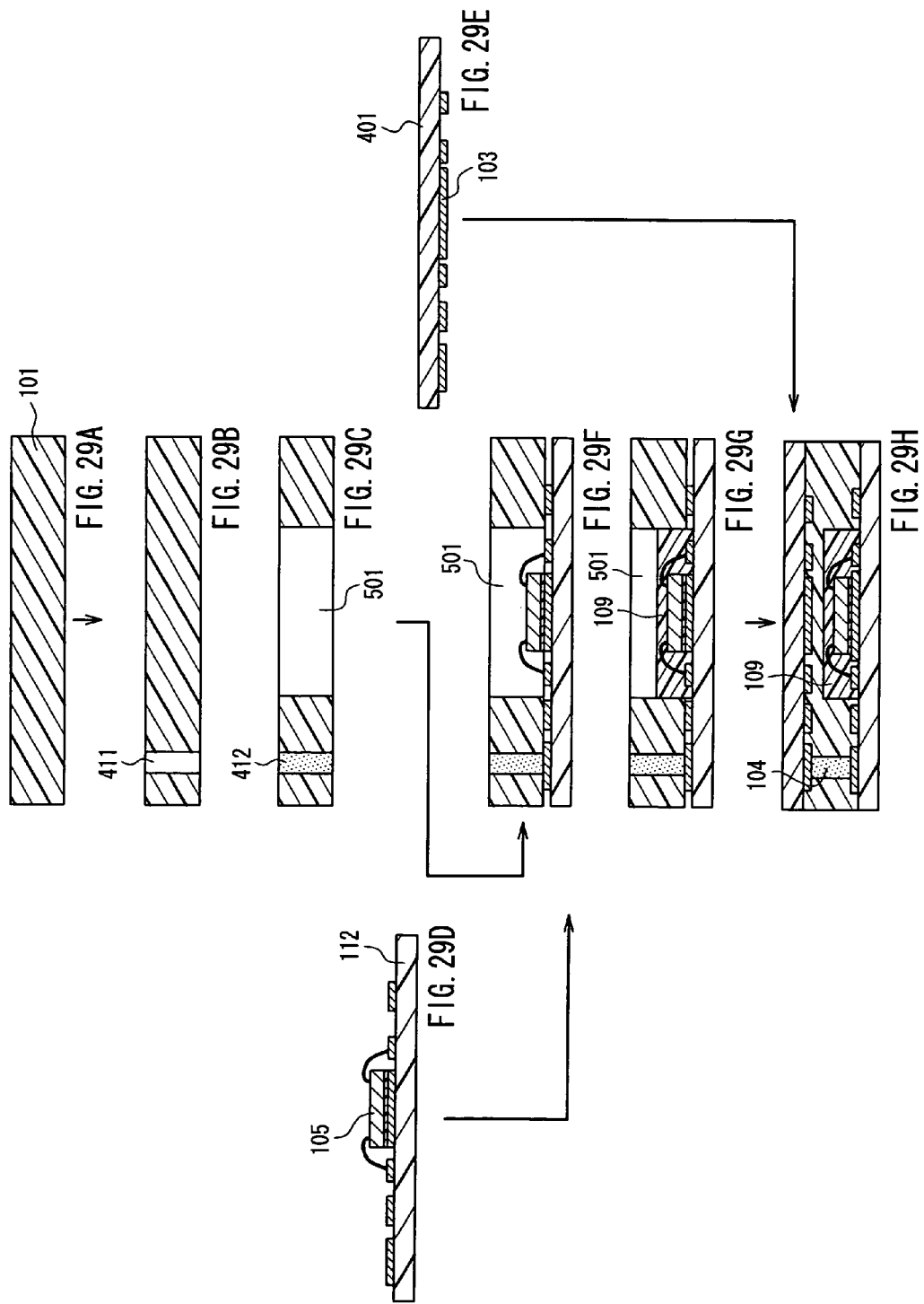

CIRCUIT COMPONENT BUILT-IN MODULE AND METHOD FOR MANUFACTURING THE SAME

BACKGROUND OF THE INVENTION

1. Field of the Invention

The present invention relates to a circuit component built-in module that contains an active component such as a semiconductor and a passive component such as a capacitor and a method for manufacturing the circuit component built-in module.

2. Description of the Related Art

With recent advances in small high-performance electronic equipment, there has been a growing demand for a semiconductor having high density and high performance. This also requires a circuit board that can achieve a smaller size and a higher density. Accordingly, a circuit component built-in module has been proposed that includes active and/or passive components and vias for electrically connecting those components and wiring patterns. Moreover, when circuit components are contained in a substrate, it is necessary to improve the heat dissipation or to adjust the thermal expansion coefficients of the substrate and the circuit components. For this purpose, a circuit component built-in module that uses a substrate material including an inorganic filler and a thermosetting resin also has been proposed (see, e.g., JP 11(1993)-220262 A and JP 2001-244638 A).

FIG. 38 is a cross-sectional view showing the configuration of a conventional circuit component built-in module (JP 2001-244638 A). In FIG. 38, reference numeral 701 is an electrical insulating substrate made of a composite material that includes an inorganic filler and a thermosetting resin, 702 is wiring patterns, 703 is a circuit component such as a semiconductor, 704 is vias for electrically connecting the wiring patterns, and 705 is a sealant for sealing a connecting portion between the circuit component and the electrical insulating substrate.

The conventional circuit component built-in module is suitable for flip-chip mounting in which the circuit component (e.g., a semiconductor) is connected with its terminals facing the wiring pattern, but not for wire bonding. For the flip-chip mounting, the circuit component and the wiring pattern are bonded generally via a metal projection of about 20 µm to 100 µm. Therefore, the gap between them is small, i.e., about 20 µm to 150 µm. In some cases an anisotropic conductive film or paste is often used, and in other cases the gap is sealed while the circuit component and the wiring pattern are bonded together. For the wire bonding, aluminum or gold wires are used to make connection. The wires generally have a diameter of 20 µm to 40 µm and a length of 0.5 mm to 3 mm. Compared with the flip-chip mounting, the wire bonding is likely to undergo a shape change such as deformation or deflection due to the above features of the wires. Thus, when the conventional circuit component built-in module is produced without using a sealant that protects the connecting portion and the wires in a process of embedding the circuit component, the resin can flow and exert a force on the wires as the circuit component is embedded in the resin. Consequently, the wires are separated and moved, resulting in a short circuit between the wires. As described above, the conventional circuit component built-in module cannot employ a low cost mounting technique such as wire bonding, which has been used widely as a general method for mounting a semiconductor of a circuit component built-in module.

SUMMARY OF THE INVENTION

Therefore, with the foregoing in mind, it is an object of the present invention to provide a circuit component built-in module that uses a low cost mounting technique such as wire bonding and also can eliminate a wire failure or short circuit, and a method for manufacturing the circuit component built-in module.

A circuit component built-in module of the present invention includes the following: an electrical insulating substrate made of a first mixture including a filler and a thermosetting resin; a wiring pattern formed on at least a principal surface of the electrical insulating substrate; circuit components that are arranged inside the electrical insulating substrate and connected electrically to the wiring pattern; and vias for electrically connecting the wiring patterns. At least one of the circuit components is an electronic component that is mounted using wires. Part or all of the wires is sealed with a second mixture including a filler and a resin.

A method for manufacturing a circuit component built-in module of the present invention includes the following: arranging circuit components on a first wiring pattern that is formed on one principal surface of a supporting base; connecting at least one of the circuit components by wire bonding; sealing part or all of wires used for the wire bonding with a second mixture including a filler and a resin; arranging the supporting base with its principal surface on which the circuit components are formed facing a first mixture including a filler and an uncured thermosetting resin; forming a sheet body by pressing the supporting base so that the circuit components are within the first mixture; and curing the thermosetting resin of the first mixture by heating the sheet body.

Another method for manufacturing a circuit component built-in module of the present invention includes the following: arranging circuit components on a first wiring pattern that is formed on one principal surface of a supporting base; connecting at least one of the circuit components by wire bonding; forming a cavity in a first mixture including a filler and an uncured thermosetting resin in accordance with sizes of the circuit components; arranging the first mixture on the supporting base so that the cavity faces the principal surface of the supporting base on which the circuit components are formed; sealing part or all of wires used for the wire bonding with a second mixture including a filler and a resin; forming a sheet body by pressing the first mixture and the supporting base so that the circuit components are within the first mixture; and curing the thermosetting resin of the first mixture by heating the sheet body.

BRIEF DESCRIPTION OF THE DRAWINGS

FIGS. 18A to 18G are cross-sectional views showing another manufacturing processes in Example 4 of the present invention.

FIGS. 21A to 21G are cross-sectional views showing manufacturing processes of a circuit component built-in module in Example 5 of the present invention.

FIGS. 23A and 23B are cross-sectional views showing another manufacturing processes in Example 5 of the present invention.

FIGS. 24A to 24C are cross-sectional views showing another manufacturing processes in Example 5 of the present invention.

FIGS. 25A to 25G are cross-sectional views showing manufacturing processes of a circuit component built-in module in Example 6 of the present invention.

FIGS. 27A to 27C are cross-sectional views showing another manufacturing processes in Example 6 of the present invention.

FIGS. 28A and 28B are cross-sectional views showing another manufacturing processes in Example 6 of the present invention.

FIGS. 29A to 29H are cross-sectional views showing manufacturing processes of a circuit component built-in module in Example 7 of the present invention.

DESCRIPTION OF THE PREFERRED EMBODIMENTS

Figure 1:
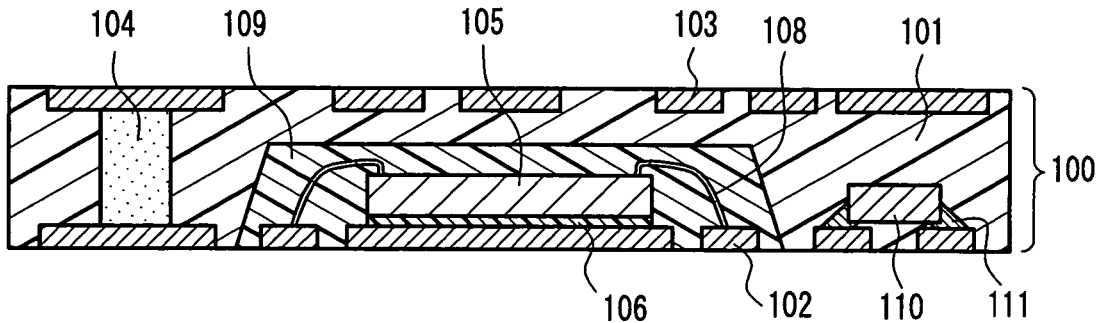
FIG. 1 is a cross-sectional view of a circuit component built-in module in Example 1 of the present invention.

In the present invention, the second mixture seals and protects the wires mounted by wire bonding, so that defects due to the flow of the resin or the like in the manufacturing process can be reduced to improve reliability after the manufacture. The thermosetting resin of the first mixture preferably includes at least one thermosetting resin selected from an epoxy resin, a phenol resin, and a cyanate resin. These resins have excellent heat resistance and electrical insulating properties.

Moreover, the filler of the first mixture preferably includes at least one inorganic filler selected from $Al_2O_3$, MgO, BN, AlN, and $SiO_2$. The filler may have an average particle size of 0.1 μm to 100 μm. These inorganic fillers can improve heat dissipation of the electrical insulating substrate. With MgO, a linear expansion coefficient of the electrical insulating substrate can be increased. With $SiO_2$, a dielectric constant of the electrical insulating substrate can be reduced. With BN, the linear expansion coefficient can be reduced. The filler content of the first mixture may be in the range of 70 wt % to 90 wt %.

In the circuit component built-in module, it is preferable that at least one of the vias is filled with a conducive resin composition. This allows the circuit components to be mounted with higher density.

In the circuit component built-in module, it is preferable that the filler content of the second mixture is larger than that of the first mixture. The filler content of the second mixture may be in the range of 80 wt % to 95 wt %. The first mixture should have flowability due to the resin content because the vias are formed for electrical connection and the circuit components are embedded. Accordingly, there is a limit to the filler content of the first mixture. The second mixture is used mainly to protect the connecting portion and the wires of wire bonding. Therefore, the filler content is less limited and can be increased. The second mixture is in contact with the circuit components, so that heat generated from the circuit components can be dissipated quickly.

In the circuit component built-in module, it is preferable that the central portion of the circuit component that is connected by wire boding is sealed with a third mixture. Unlike the first and second mixtures, the third mixture has no particular limitation and thus can include any filler or resin to dissipate heat generated from the circuit components quickly. Thus, the use of the third mixture can improve heat dissipation.

The central portion of the circuit component is not limiting on the precise position. The same effect can be obtained as long as the third mixture is arranged while the connecting portion and the wires are sealed with the second mixture.

In the circuit component built-in module, it is preferable that thermal vias are formed in the first mixture or the third mixture. The use of the thermal vias further can improve heat dissipation.

In the circuit component built-in module, it is preferable that the filler of the third mixture includes a thermal conductive filler. The thermal conductive filler can provide high heat dissipation. Moreover, grounding can be enhanced by arranging the ground planes of the circuit components and the ground terminals of the wiring patterns. It is further preferable that the thermal conductive filler is particles including at least one selected from $Al_2O_3$, BN, and AlN. These particles have low electric resistance and high heat conductivity. The filler content of the third mixture may be in the range of 85 wt % to 95 wt %. The filler may have an average particle size of 0.1 μm to 50 μm.

In the circuit component built-in module, it is preferable that the filler of the first mixture includes a hollow filler. The hollow inside the filler contributes to reducing a dielectric constant. Moreover, the hollow filler has high heat insulating properties. Therefore, when a component is mounted on the circuit component built-in module by reflowing, or when the circuit component built-in module is mounted on a substrate, heat is not likely to be transferred to the built-in circuit components. This makes it possible to reduce the heat degradation of the built-in circuit components and to prevent problems such as a short circuit caused by remelting of the solder in the connecting portion of the built-in circuit components. As an example of the hollow filler, the outer wall is made of acrylic resin, and the porosity is about 30% to 50%. The hollow filler may have an average particle size of 10 μm to 50 μm. The outer wall also can be made of glass.

In the circuit component built-in module, at least a portion of the surface of a sealant made of the second mixture that forms an interface with a sealant made of the first mixture may be roughened or provided with a pre-treated film. This configuration can improve the adhesion of the interface between the sealant of the second mixture and the sealant of the first mixture. The pre-treated film may be formed, e.g., by the application of a coupling agent.

In the circuit component built-in module, the electronic component may be a semiconductor chip, a shield may be arranged on the surface of the semiconductor chip that is opposite to the wires, at least one antenna circuit may be formed on the side of the semiconductor chip and spaced apart, and the whole of the module may be covered with a card package resin. This configuration can suppress the effect of noise by the shield.

The manufacturing method of the present invention can provide a circuit component built-in module efficiently and reasonably. In the manufacturing method of the present invention, it is preferable that the connection terminals of the at least one circuit component connected by wire bonding are located on the periphery of the circuit component, the method further includes sealing the central portion of the circuit component with a third mixture including a filler and a resin, and the process of sealing with the third mixture is performed after the process of sealing with the second mixture and before the process of forming the sheet body. This method can facilitate the application of the third mixture that improves heat dissipation of the built-in circuit components.

The circuit components connected by wire bonding are not limited to a semiconductor, and may be, e.g., a chip-shaped resistance, capacitor, inductor, varistor, or module component including these devices. The resin of the second or third mixture preferably is a thermosetting resin because it can be cured at the same time as the thermosetting resin of the first mixture. However, as long as the second mixture protects the connecting portion and the wires of wire bonding, and the third mixture provides desired heat dissipation, then the resin may be a thermoplastic resin or the like.

In the circuit component built-in module of the present invention, the second mixture may seal and protect at least the wires, and preferably the connecting portion and the wires, of the wire bonding. Therefore, defects due to the flow of the resin or the like in the manufacturing process can be reduced to improve reliability after the manufacture as compared with a conventional example.

EXAMPLES

Hereinafter, examples of the present invention will be described with reference to the drawings.

Example 1

Figure 2:
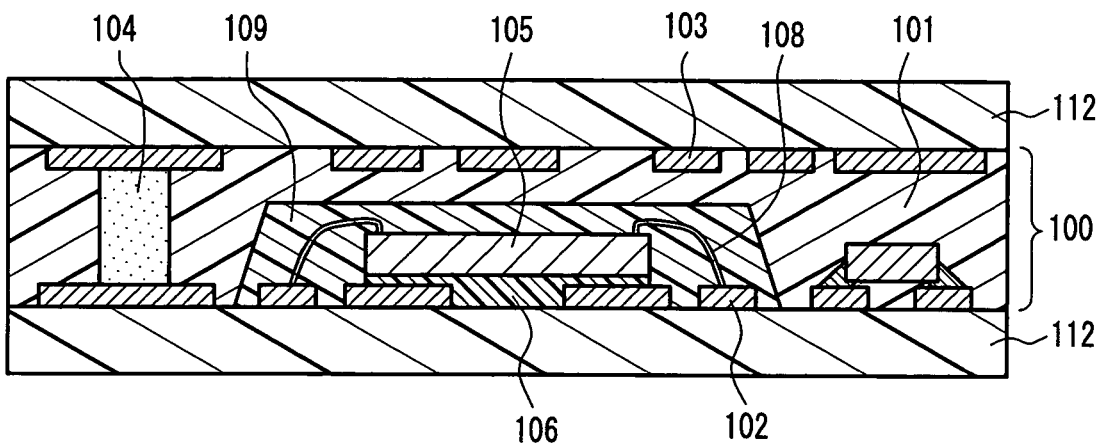
FIG. 2 is a cross-sectional view of another circuit component built-in module in Example 1 of the present invention.

Example 1 of the present invention will be described by referring to FIGS. 1 to 5. FIGS. 1 to 5 are cross-sectional views showing the configuration of a circuit component built-in module of this example. In FIG. 1, reference numeral 100 is a circuit component built-in module, 101 is a composite material (a first mixture), and 102 and 103 are wiring patterns. The composite material 101 includes a filler and a thermosetting resin. In this case, 15 wt % of liquid epoxy resin ("EF-450" produced by Japan Rec Co., Ltd.) is used as the thermosetting resin, and 85 wt % of alumina powder ("AS-40" produced by SHOWA DENKO K.K., which is spherical with an average particle size of 12 μm) is used as the inorganic filler. Reference numeral 104 is vias for electrically connecting the wiring patterns 102 and 103. Reference numeral 105 is a semiconductor chip (a circuit component) contained in the circuit component built-in module 100. Reference numeral 106 is a die bond ("QMI527" produced by Henkel Japan Ltd.) for bonding the wiring pattern 102 and the semiconductor chip 105. As shown in FIG. 2, the semiconductor chip 105, the wiring pattern 102, and a supporting base 112 may be bonded together by the die bond 106. The supporting base 112 may be, e.g., a printed board, a circuit component mounted module, or a circuit component built-in module of this example. Reference numeral 108 is wires for connecting the semiconductor chip 105 and the wiring pattern 102 by wire bonding. Reference numeral 109 is a sealant ("CB011R-3" produced by Henkel Japan Ltd.) for sealing the connecting portion of wire bonding and part or all of the wires 108. The sealant 109 is a second mixture that includes a filler and a resin. Reference numeral 110 is a chip component (a circuit component) contained in the circuit component built-in module 100. The chip component 110 is connected to the wiring pattern 102 by solder 111.

In addition to the solder 111, a conductive resin composition, wires, or bumps may be used to connect the chip component 110. The conductive resin composition may include 80 wt % of silver (a sphere-to-flake ratio of 1:1) as a conductive filler, an epoxy resin, and an amine-based curing agent.

The sealant 109 seals and protects the connecting portion and the wires of wire bonding, so that defects due to the flow of the resin or the like in the manufacturing process can be reduced to improve reliability after the manufacture.

The thermosetting resin of the composite material 101 (the first mixture) preferably includes at least one thermosetting resin selected from an epoxy resin, a phenol resin, and a cyanate resin. These resins have excellent heat resistance and electrical insulating properties. The first mixture further may include a dispersant, a colorant, a coupling agent, and a release agent. Moreover, the filler of the first mixture may include at least one inorganic filler selected from $Al_2O_3$, MgO, BN, AlN, and $SiO_2$.

Figure 3:
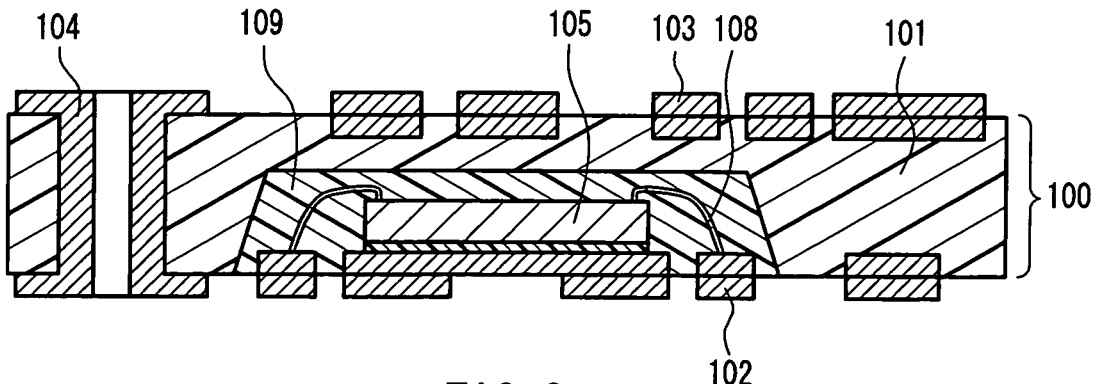
FIG. 3 is a cross-sectional view of another circuit component built-in module in Example 1 of the present invention.

Although the vias 104 may have a through hole as shown in FIG. 3, it is preferable that no through hole is formed in the vias 104 as shown in FIG. 1. When the electrical connection is made without any through holes, the circuit components can be mounted with high density. The vias 104 may be formed by filling the through holes with plating, and preferably with a conductive resin composition. The conductive resin composition may be produced by mixing and kneading the following materials: 85 wt % of spherical copper particles; 3 wt % of bisphenol A epoxy resin ("Epikote 828" produced by Japan Epoxy Resins Co., Ltd.); 9 wt % of glycidyl ester epoxy resin ("YD-171" produced by Tohto Kasei Co., Ltd.); and 3 wt % of an amine adduct curing agent ("MY-24" produced by Ajinomoto Co., Inc.). The use of the conductive resin composition is advantageous because in a process of curing the thermosetting resin of the first mixture, the first mixture can be cured and formed at the same time as the conductive resin composition, thus improving productivity. The curing process is performed, e.g., by heating at 175° C. for 60 minutes.

Figure 4:
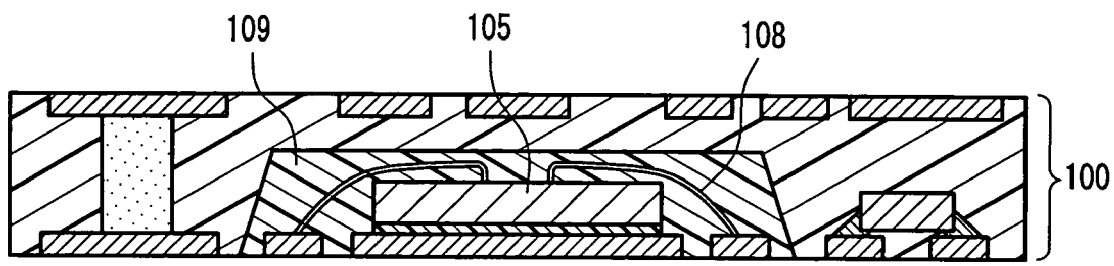
FIG. 4 is a cross-sectional view of another circuit component built-in module in Example 1 of the present invention.

As shown in FIG. 4, the connection terminals may be provided in the central portion of the semiconductor chip 105. This structure also can be seen in a memory or the like.

Figure 5:
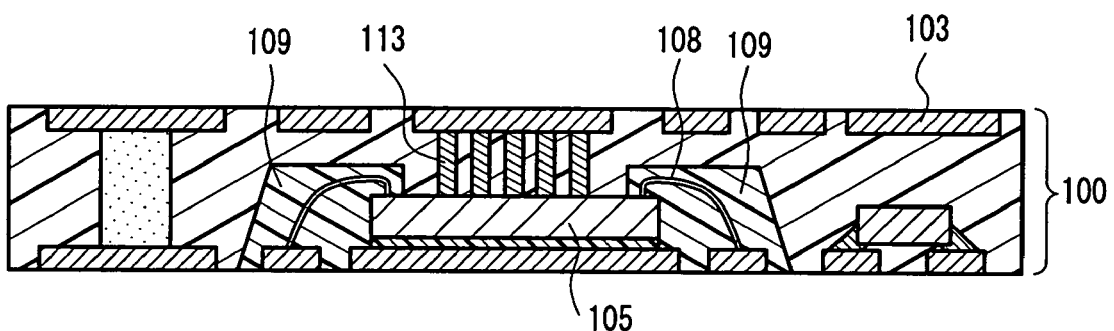
FIG. 5 is a cross-sectional view of another circuit component built-in module in Example 1 of the present invention.

As shown in FIG. 5, when thermal vias 113 are arranged between the semiconductor chip 105 and the wiring pattern 103, heat generated from the semiconductor chip 105 can be transferred efficiently to the wiring pattern 103, and thus high heat dissipation can be achieved. The thermal vias 113 may be formed by using a conductive resin composition that includes a conductive filler and a resin. The conductive resin composition may be produced by mixing and kneading the following materials: 85 wt % of spherical copper particles; 3 wt % of bisphenol A epoxy resin ("Epikote 828" produced by Japan Epoxy Resins Co., Ltd.); 9 wt % of glycidyl ester epoxy resin ("YD-171" produced by Tohto Kasei Co., Ltd.); and 3 wt % of an amine adduct curing agent ("MY-24" produced by Ajinomoto Co., Inc.). Moreover, it is preferable that the conductive filler is metal particles, metal alloy particles, or graded alloy particles that include at least one metal selected from gold, silver, copper, nickel, lead, tin, and aluminum. These conductive fillers have high heat conductivity.

The filler content of the sealant 109 preferably is larger than that of the composite material 101 as shown in FIGS. 1 to 5. In this example, the composite material 101 includes 85 wt % of alumina powder, while the sealant 109 includes 87.5 wt % of the same alumina powder. When the filler content is increased, the flowability of the resin is suppressed during the manufacturing process. Therefore, the wires 108 do not move easily, and a short circuit can be reduced. Moreover, the heat conductivity can be improved by increasing the filler content. The sealant 109 is in contact with the semiconductor chip 105, so that heat generated from the semiconductor chip 105 can be dissipated quickly.

When the adhesion between the sealant 109 and the composite material 101 is insufficient, the sealant 109 peels away from the interface of the composite material 101 due to a heating process such as reflowing, which may result in a defect. Therefore, it is preferable that the sealant 109 does not include any release agent (e.g., a silicone release agent).

Figure 32:
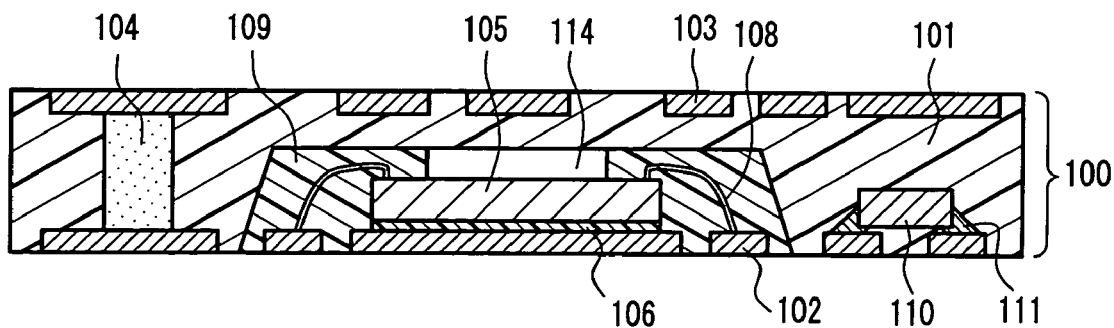
FIG. 32 is a cross-sectional view of another circuit component built-in module in Example 1 of the present invention.

Instead of the configuration in FIG. 1, the sealant 109 may be applied with a space 114 present in the central portion of the top surface of the semiconductor chip 105, as shown in FIG. 32.

Figure 33:
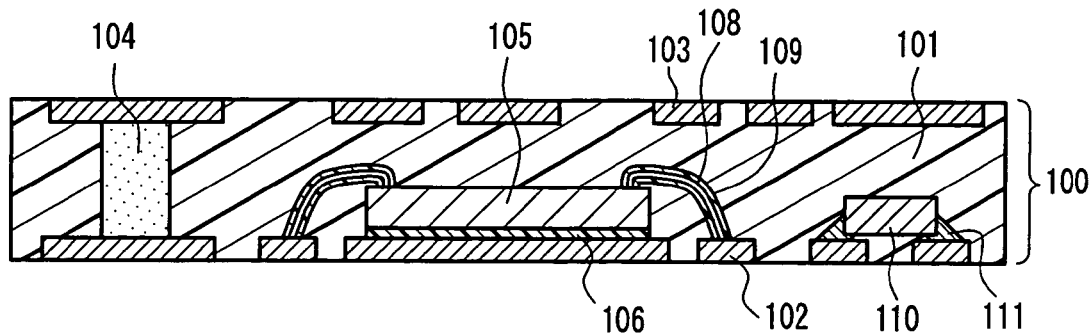
FIG. 33 is a cross-sectional view of another circuit component built-in module in Example 1 of the present invention.

Alternatively, the sealant 109 may be applied to cover part or all of the wires 108, as shown in FIG. 33. This allows the wires 108 to be fixed and have strength sufficient to withstand the pressure when they are forced into the composite material 101, and finally the wires 108 are sealed with the composite material 101.

Example 2

Figure 6:
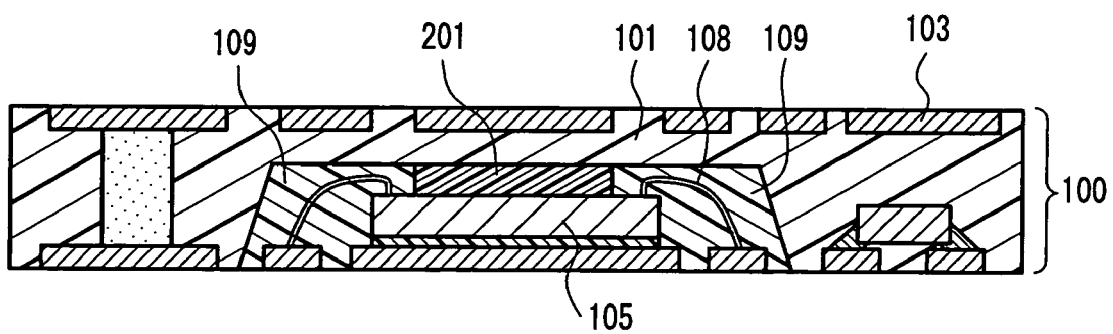
FIG. 6 is a cross-sectional view of a circuit component built-in module in Example 2 of the present invention.

Example 2 of the present invention will be described by referring to FIGS. 6 to 10. FIGS. 6 to 10 are cross-sectional views showing the configuration of a circuit component built-in module of this example. FIG. 6 differs from FIG. 1 in that a high thermal conductive sealant 201 is arranged between the sealant 109, the semiconductor chip 105, and the composite material 101. The high thermal conductive sealant 201 includes 10 wt % of liquid epoxy resin as a liquid thermosetting resin and 90 wt % of alumina powder as an inorganic filler. In this example, the connection terminals are located on the periphery of the semiconductor chip 105. When the high thermal conductive sealant 201 is arranged in the central portion of the semiconductor chip 105, heat generated from the semiconductor chip 105 can be transferred efficiently.

The periphery and the central portion of the semiconductor chip 105 need not be considered as precise positions. The same effect can be obtained as long as the high thermal conductive sealant 201 is arranged while the connecting portion and the wires 108 are sealed with the sealant 109.

Figure 7:
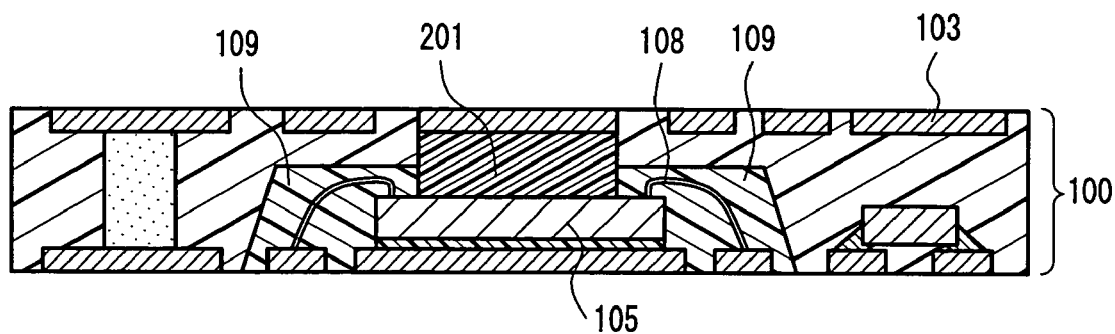
FIG. 7 is a cross-sectional view of another circuit component built-in module in Example 2 of the present invention.

As shown in FIG. 7, when the high thermal conductive sealant 201 comes into contact with the wiring pattern 103, heat can be dissipated efficiently.

Figure 8:
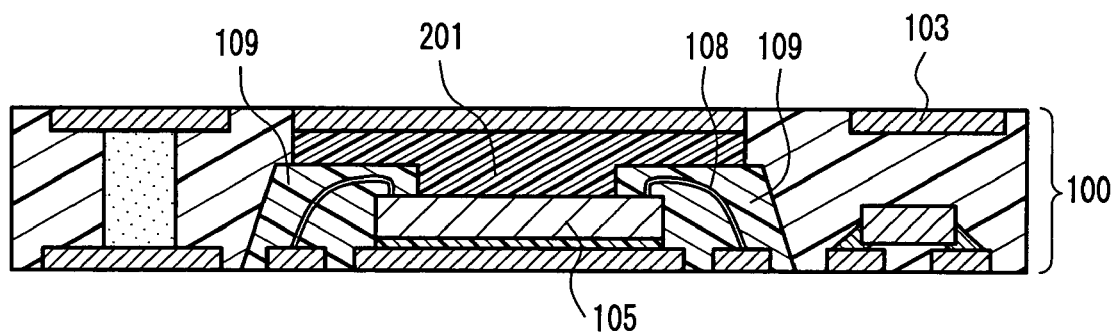
FIG. 8 is a cross-sectional view of another circuit component built-in module in Example 2 of the present invention.

As shown in FIG. 8, when the high thermal conductive sealant 201 extends above the sealant 109 and comes into contact with the wiring pattern 103 in a large area, heat can be dissipated more efficiently.

Figure 9:
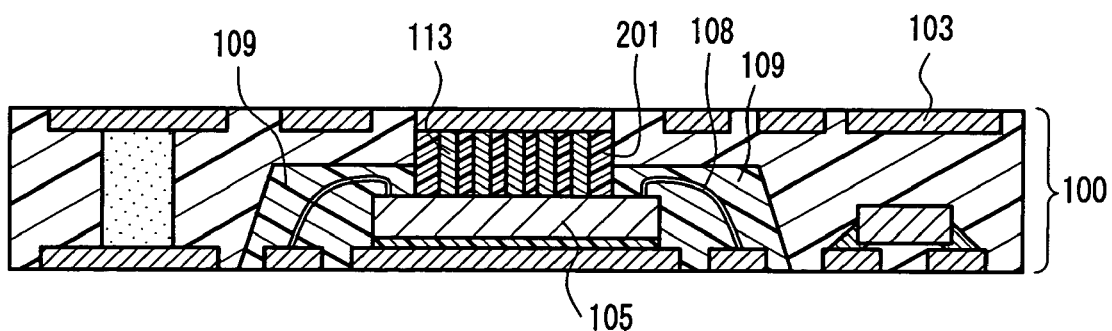
FIG. 9 is a cross-sectional view of another circuit component built-in module in Example 2 of the present invention.
Figure 10:
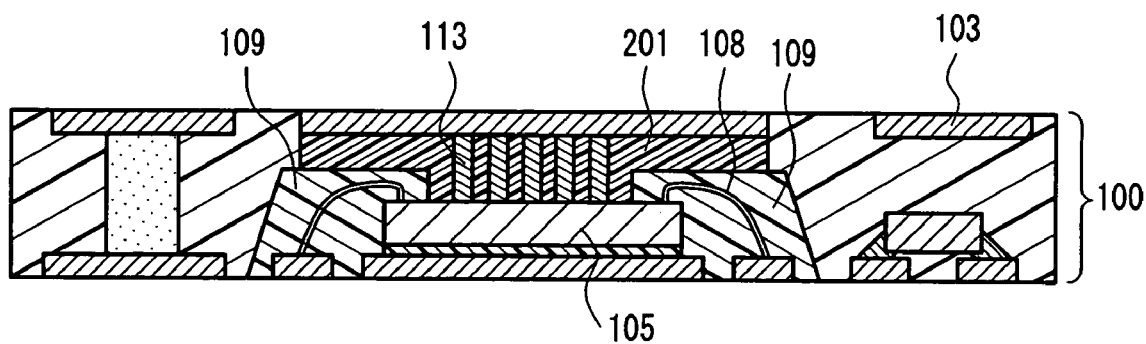
FIG. 10 is a cross-sectional view of another circuit component built-in module in Example 2 of the present invention.

As shown in FIGS. 9 and 10, when thermal vias are formed in the high thermal conductive sealant 201, heat can be dissipated even more efficiently.

The high thermal conductive sealant 201 in FIGS. 6 to 10 preferably includes a thermal conductive filler. The thermal conductive filler can provide high heat dissipation. Moreover, grounding can be enhanced by arranging the ground planes of the circuit components and the ground terminals of the wiring patterns.

It is further preferable that the thermal conductive filler is particles including at least one selected from $Al_2O_3$, BN, and AlN. These particles have low electric resistance and high heat conductivity.

When the adhesion between the high thermal conductive sealant 201 and the composite material 101 is insufficient, the high thermal conductive sealant 201 peels away from the interface of the composite material 101 due to a heating process such as reflowing, which may result in a defect. Like Example 1, therefore, it is preferable that the high thermal conductive sealant 201 does not include any release agent.

Example 3

Figure 11:
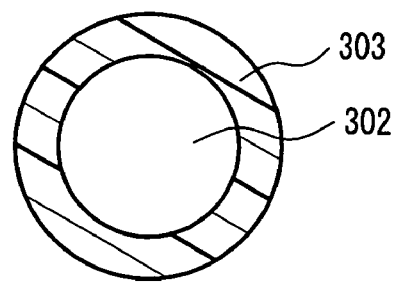
FIG. 11 is a cross-sectional view showing the shape of a filler included in a composite material of a circuit component built-in module in Example 3 of the present invention.
Figure 12:
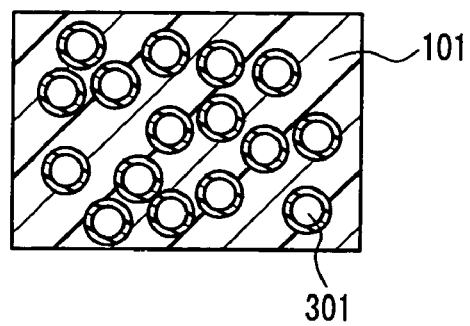
FIG. 12 shows the composite material in which a hollow filler is dispersed in Example 3 of the present invention.

Example 3 of the present invention will be described by referring to FIGS. 11 to 15. FIG. 11 is a cross-sectional view showing the shape of a filler included in the composite material 101 of a circuit component built-in module of this example. There is a hollow 302 inside the filler, and a resin outer wall 303 defines the hollow 302. FIG. 12 shows the composite material 101 in which a hollow filler 301 is dispersed. In this case, the outer wall of the hollow filler 301 is made of acrylic resin, the porosity is about 50%, and the average particle size is 20 µm. Other materials, dimensions and porosities may be useful.

When a component is mounted on the circuit component built-in module as shown in FIG. 1 by reflowing, or when the circuit component built-in module is mounted on a substrate, the semiconductor chip 105 or the chip component 110 may be degraded at 220° C. to 250° C. or more, and the solder 111 in the connecting portion may be remelted to cause a short circuit or the like. However, these problems can be suppressed by using the composite material 101 as shown in FIG. 12 because the composite material 101 has lower heat conductivity and thus can reduce the temperature of the built-in components or the connecting portion during reflowing. For example, the connecting portion between built-in components has a peak temperature of 230° C. for about 10 seconds during general lead-free reflowing, compared with a peak temperature of 200° C. for about 5 seconds in this example.

When semiconductor chip 105 is mounted by a connection method other than wire bonding, such as flip-chip mounting, or when the vias 104 are not formed, the above problems can be suppressed by using the hollow filler 301.

The hollow inside the filler contributes to reducing a dielectric constant. Therefore, when the circuit is used at high frequencies, it can exhibit high transmission performance.

The hollow filler 301 may interfere with heat dissipation during the operation of the semiconductor chip 105. Accordingly, the configuration that includes the high thermal conductive sealant 201 as described in Example 2 is preferred.

In FIGS. 11 and 12, the hollow filler 301 is spherical. However, even if the filler is not spherical, the same effect can be obtained as long as it has a hollow structure.

Figure 13:
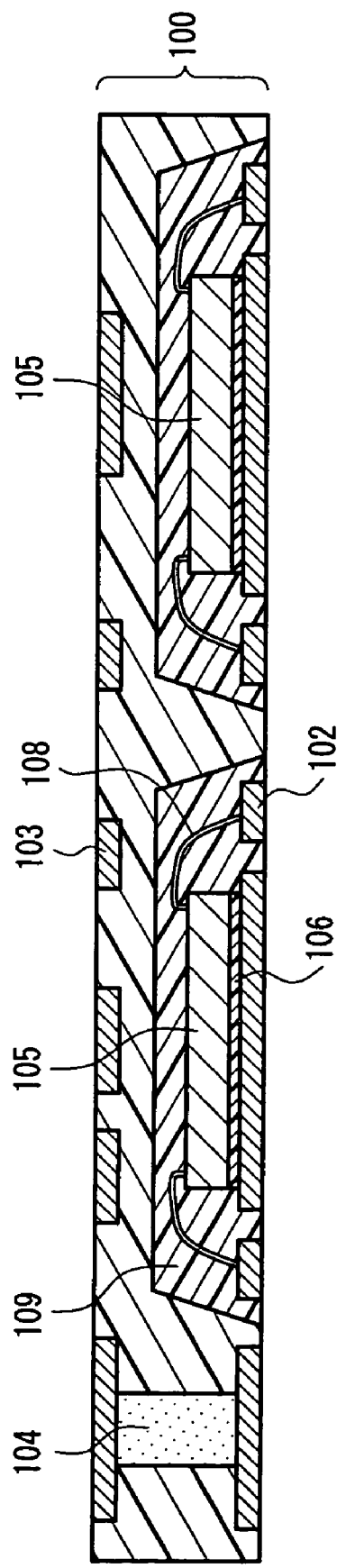
FIG. 13 is a cross-sectional view of a circuit component built-in module in Example 3 of the present invention.
Figure 14A:
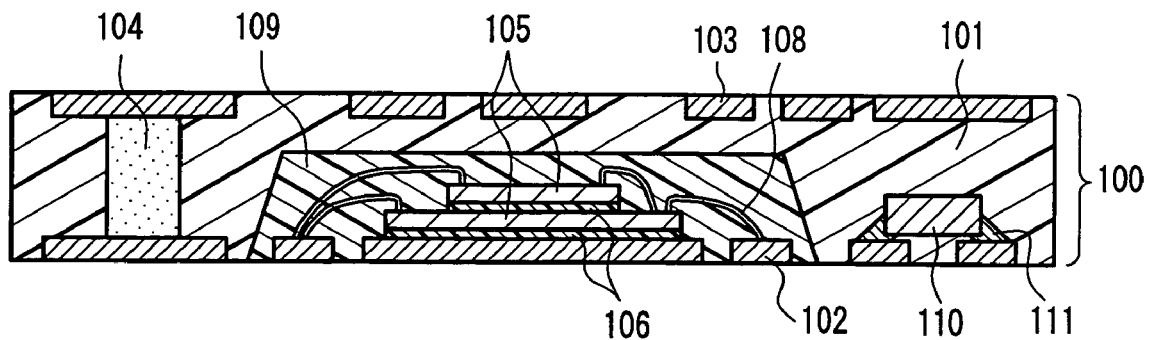
FIG. 14A is a cross-sectional view of another circuit component built-in module in Example 3 of the present invention.
Figure 14B:
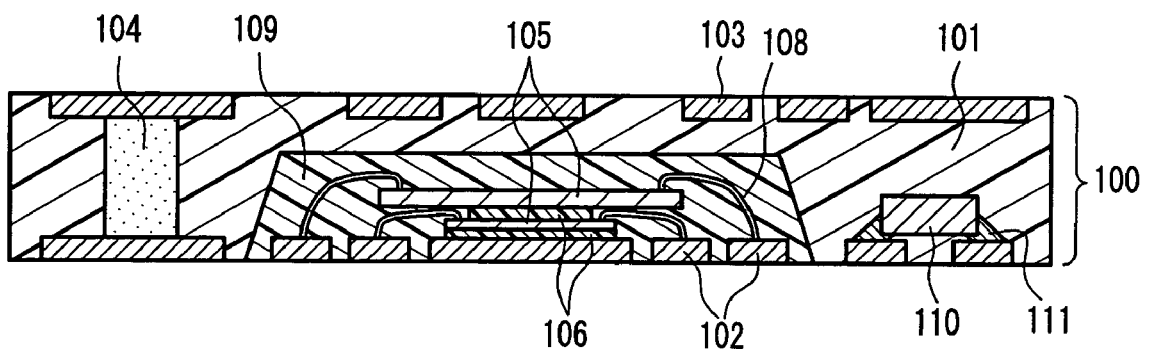
FIG. 14B is a cross-sectional view of another circuit component built-in module in Example 3 of the present invention.

In FIGS. 1 to 10, each module contains a single semiconductor chip 105. However, a plurality of semiconductor chips 105 may be arranged in a plane, as shown in FIG. 13. Moreover, a plurality of semiconductor chips 105 may be stacked in layers by the die bond 106, connected by the wires 108, and sealed with the sealant 109, as shown in FIG. 14A. Further, a plurality of semiconductor chips 105 may be stacked in layers by the die bond 106 so that the area of the lower chip is smaller than that of the upper chip, connected by the wires 108, and sealed with the sealant 109, as shown in FIG. 14B. In this case, vacuum forming is used preferably for sealing because the sealant 109 can be filled into the inside of the complex structure. The vacuum forming is a method for supplying a coating material from a dispenser in a chamber under reduced pressure. This method can be performed by using a vacuum forming apparatus (e.g., "VE500" manufactured by Toray Engineering Co., Ltd.). Since the upper chip is larger than the lower chip, the configuration in FIG. 14B can increase the wiring capacity and make the module compact as a whole.

Figure 15:
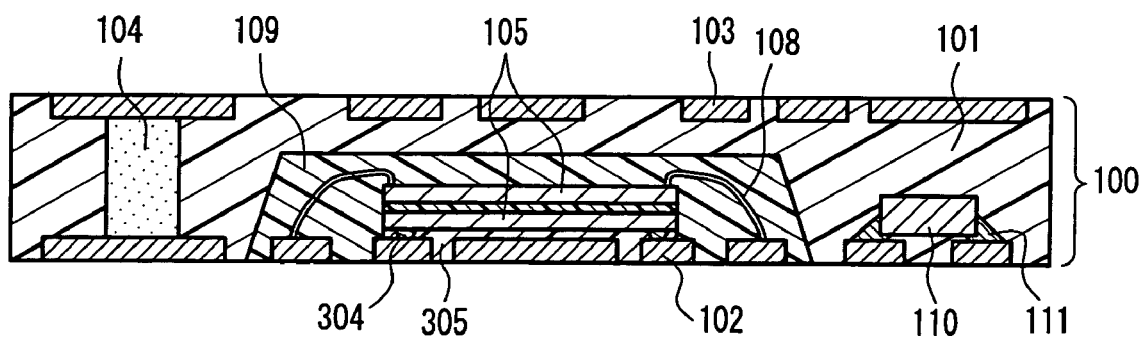
FIG. 15 is a cross-sectional view of another circuit component built-in module in Example 3 of the present invention.

Alternatively, a plurality of semiconductor chips 105 may be stacked in layers and connected in different manners: one of the semiconductor chips 105 may be connected by flip-chip mounting so that semiconductor connecting portions 304 are in contact with the wiring pattern 102 and sealed with a sealant 305; and the others may be connected by wires 108, as shown in FIG. 15. The module may contain only the semiconductor chip 105 or the chip component 111 as long as they are connected by wire bonding. A resist may be formed in a portion other than the connecting portions of the wiring patterns 102 and 103.

Example 4

In Example 4, an example of manufacturing processes of the circuit component built-in module in Examples 1 and 3 will be described. The materials and circuit components used in Example 4 are the same as those in Examples 1 to 3. FIGS. 16A to 16G are cross-sectional views showing an example of the manufacturing processes of the circuit component built-in module. In FIG. 16A, the composite material 101 includes a mixture of a filler and an uncured thermosetting resin and other additives. For the mixture, 90 wt % of $Al_2O_3$ ("AS-40" produced by SHOWA DENKO K.K., which is spherical with an average particle size of 12 µm) is used as the inorganic filler, and 9.5 wt % of liquid epoxy resin ("EF-450" produced by Japan Rec Co., Ltd.) is used as the thermosetting resin. For the additives, 0.2 wt % of carbon black (produced by Toyo Carbon Co., Ltd.) and 0.3 wt % of coupling agent (titanate-based "46B" produced by Ajinomoto Co., Inc.) are added. The composite material 101 is processed in a sheet form in the following manner. First, the filler and the liquid thermosetting resin are mixed into a paste mixture. Alternatively, the thermosetting resin is dissolved in a solvent to have a low viscosity, and then is mixed with the filler into a paste mixture. In this case, e.g., 1 wt % of methyl ethyl ketone (MEK) may be added and mixed, e.g., by using a stirring and defoaming apparatus (manufactured by Matsuo Sangyo Co., Ltd.). The addition of MEK reduces the viscosity of the mixture, so that it can be formed into a slurry. Next, a predetermined amount of the paste mixture is dropped on a release film. The release film may be a 75 µm thick polyethylene terephthalate film whose surface is subjected to a release treatment with silicon.

Subsequently, another release film is put on the paste mixture that has been dropped on the release film, and then is pressed to a thickness of 500 µm using a press, thus providing a sheet mixture. The sheet mixture sandwiched between the release films is heated so as to eliminate the adhesive properties of the sheet mixture. When the sheet mixture includes a liquid thermosetting resin, the heat treatment cures the liquid thermosetting resin to some extent, and thus the adhesive properties of the sheet mixture can be eliminated while maintaining its flexibility in the uncured state. When the sheet mixture includes a thermosetting resin dissolved in a solvent, the heat treatment removes the solvent, and thus the adhesive properties of the sheet mixture can be eliminated while maintaining its flexibility in the uncured state. Since the sheet mixture loses the adhesive properties by the heat treatment, the release films can be removed easily. The heat treatment is performed at 120° C. for 15 minutes. The liquid epoxy resin used in this example has a curing temperature of 130° C., and therefore it is not cured (B stage) under the above heat treatment conditions.

As shown in FIG. 16B, a through hole 411 is formed in the uncured sheet material (the composite material 101) thus provided. Any process of laser beam machining, molding, or punching may be used to form the through hole 411. Particularly for the laser beam machining, a carbon dioxide gas laser or excimer laser is effective due to their high processing speed.

In FIG. 16C, the through hole 411 formed in the composite material 101 is filled with a conductive resin composition 412. The conductive resin composition 412 may be produced by mixing and kneading a conductive material such as gold, silver, or copper powder with the same thermosetting resin of the composite material 101. In this case, copper is particularly effective because it has good conductivity and less migration. Moreover, a liquid epoxy resin is preferred as the thermosetting resin because it has stable heat resistance.

In FIG. 16D1, the chip component 110 is mounted on the wiring pattern 102 by the solder 111. A copper foil that has a thickness of about 12 µm to 35 µm and is produced by electroplating may be used as the wiring pattern 102. To improve the adhesion between the wiring pattern 102 and the composite material 101, it is particularly preferable that the surface of the copper foil in contact with the composite material 101 is roughened. A copper foil whose surface is subjected to a coupling treatment or plated with tin, zinc, or nickel also can be used not only to improve the adhesion, but also to prevent oxidation. In addition to the solder 111, a conductive resin composition also can be used to make the electrical connection. The conductive resin composition may be produced by mixing and kneading gold, silver, copper, silver-palladium alloy, or gold-copper graded alloy with a thermosetting resin.

In FIG. 16D2, the semiconductor chip 105 is bonded to the wiring pattern 102 and the supporting base 112 by the die bond 106, and the semiconductor chip 105 and the wiring pattern 102 are connected electrically by the wires 108.

In FIG. 16D3, the semiconductor chip 105 mounted as shown in FIG. 16D2 is molded with the sealant 109. The sealant 109 may be applied by a dispensing or screen printing method. Although transfer molding has excellent productivity, a release agent should be added generally to the sealant 109 so as to improve releasability from the molding die. When the adhesion between the sealant 109 and the composite material 101 is insufficient, the sealant 109 peels away from the interface of the composite material 101 due to a heating process such as reflowing, which may result in a defect. With the dispensing or screen printing method, it is not necessary to add the release agent to the sealant 109, thus improving reliability.

After application, the sealant 109 is cured by hot air or infrared radiation, e.g., at 125° C. for 30 minutes. Light such as ultraviolet radiation also can be used. In this case, it is preferable that the sealant 109 is semi-cured rather than completely cured. This is because the adhesion between the sealant 109 and the composite material 101 can be improved by curing them together in the subsequent heating and pressing process as shown in FIG. 16G.

In FIGS. 16A to 16G, only the semiconductor chip 105 is sealed. However, the chip component 110 may be sealed as well. The chip component 110 may be mounted after the process in FIG. 16D2, followed by the sealing process in FIG. 16D3. The chip component 110 also may be mounted as shown in FIG. 16D1 after successively performing the processes in FIGS. 16D2 and 16D3.

Next, FIG. 16E shows the wiring pattern 103 formed on a supporting base 401. In FIG. 16F, the composite material 101 that has been produced by the above method, the supporting base 112 on which the semiconductor chip 105 is mounted, and the supporting base 401 are aligned and superimposed over one another.

As shown in FIG. 16G, the layered material is heated and pressed, e.g., at 120° C. and 10 kg/cm$^2$ for 5 minutes by using a press. The temperature is lower than the curing temperature of the thermosetting resin of the composite material 101. Therefore, the thermosetting resin is softened, and the circuit components can be embedded easily in the composite material 101, thus forming an integrated sheet body containing the semiconductor chip 105. This sheet body formation process is performed before curing the thermosetting resin of the composite material 101. Then, the sheet body further is heated and pressed at 175° C. and 50 kg/cm$^2$ for 60 minutes, so that the thermosetting resin in the composite material 101 and the conductive resin composition 412 is cured completely. As a result, the composite material 101, the semiconductor chip 105, and the wiring patterns 102, 103 are bonded firmly and mechanically. Moreover, the conductive resin composition 412 is cured and fixed as the via 104 for electrically connecting the wiring patterns 102 and 103.

After removing the supporting bases 112, 401, a circuit component built-in module of the present invention is provided. In this case, the supporting bases 112, 401 can use either a release film such as polyethylene terephthalate or a metallic release material.

Figure 17:
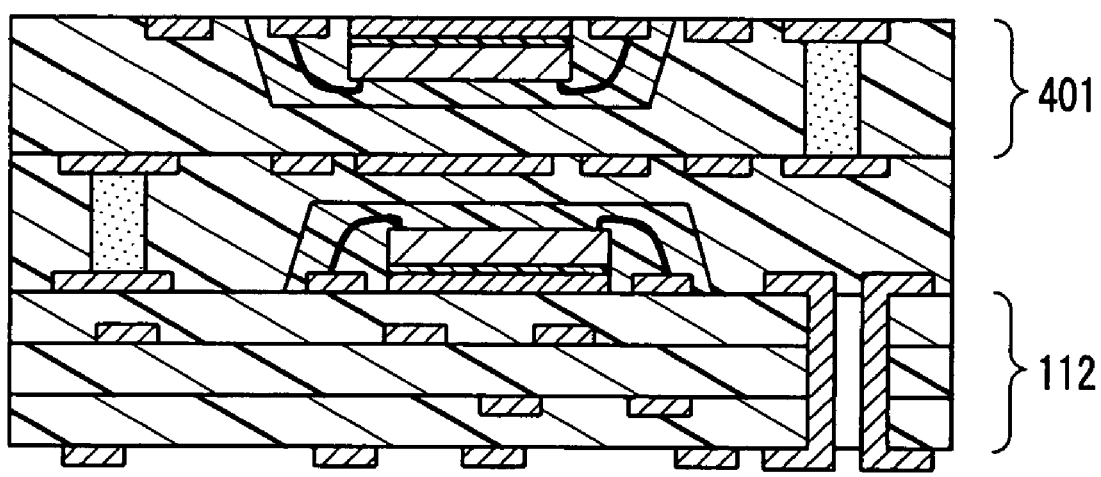
FIG. 17 is a cross-sectional view of a circuit component built-in module in Example 4 of the present invention.

Moreover, the supporting bases 112, 401 may be, e.g., a printed board, a circuit component mounted module, or a circuit component built-in module of this example. FIG. 17 shows an example of this configuration. In FIG. 17, a circuit component built-in module of the present invention is used as the supporting base 401, and a multilayer printed wiring board is used as the supporting base 112.

In the above explanation, the central portion of the semiconductor chip 105 is sealed with the sealant 109. However, it is also possible not to seal the central portion of the semiconductor chip 105 with the sealant 109, as shown in FIGS. 18A to 18G.

Figure 16:
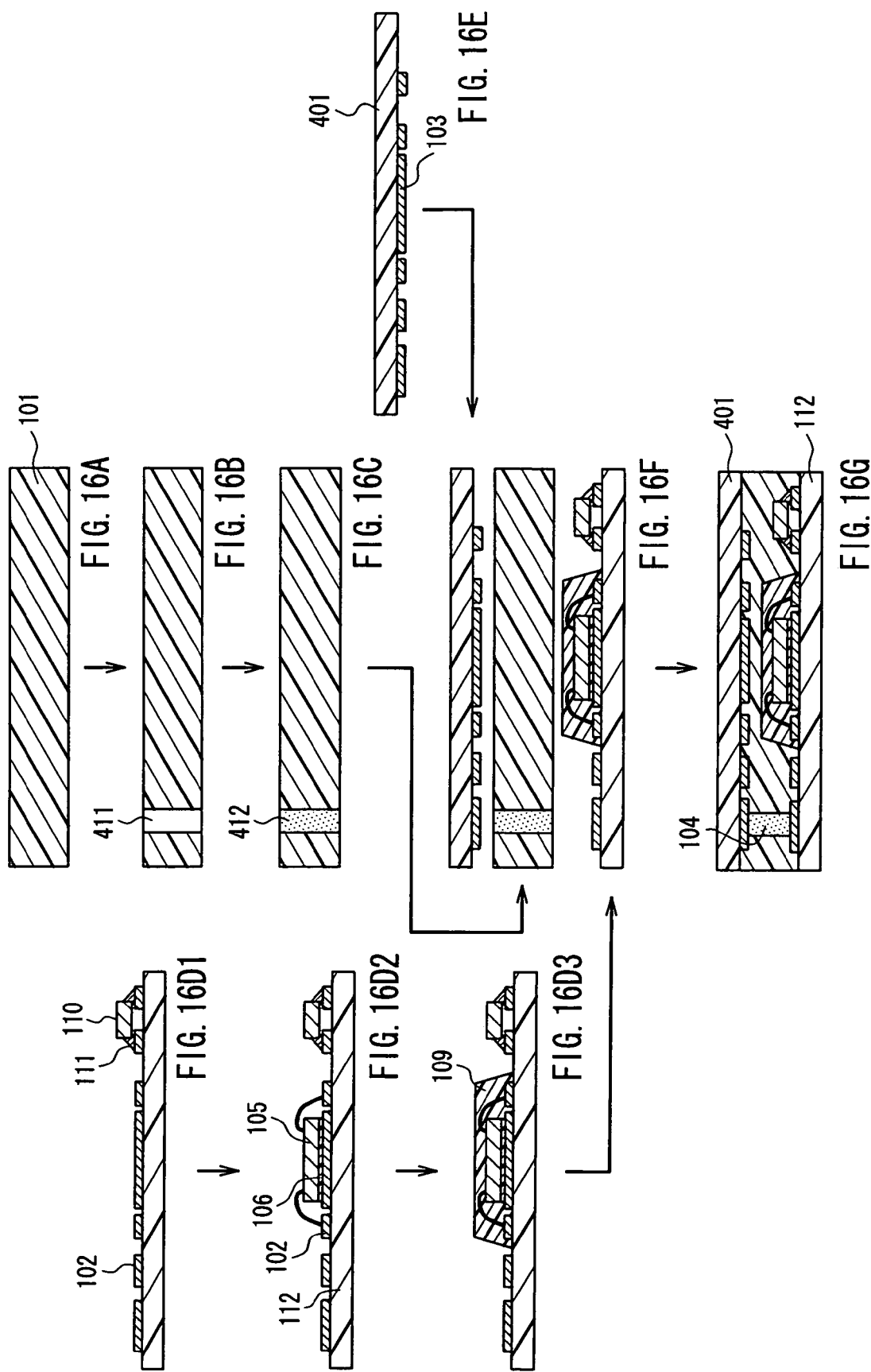
FIGS. 16A to 16G are cross-sectional views showing manufacturing processes of a circuit component built-in module in Example 4 of the present invention.

FIGS. 18A and 18B are the same as FIGS. 16A and 16B, respectively. In FIG. 18C, a plurality of cavities are formed in the composite material 101. FIGS. 18D1, 18D2, and 18E are the same as FIGS. 16D2, 16D3, and 16E, respectively. Then, a sheet body as shown in FIG. 18G can be provided in the same manner as shown in FIG. 16.

Figure 19A:
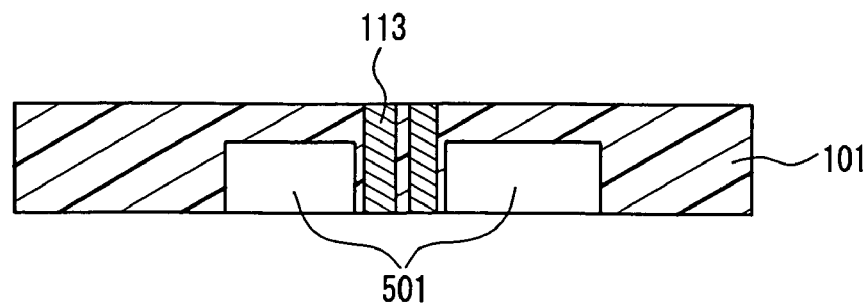
FIGS. 19A and 19B are cross-sectional views showing another manufacturing processes in Example 4 of the present invention.
Figure 19B:
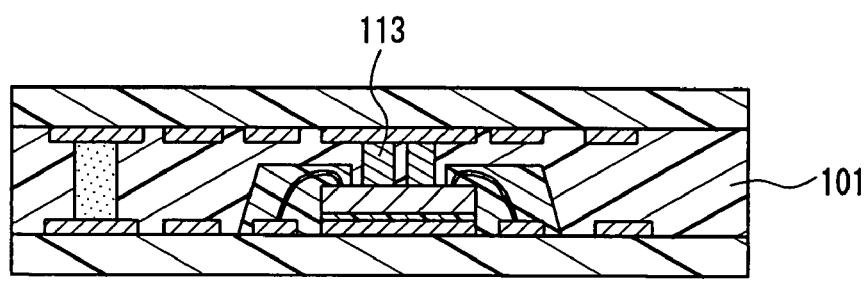

When thermal vias 113 are formed in the composite material 101 as shown in FIG. 19A, which corresponds to FIG. 18C, the sheet body in FIG. 18G can have the thermal vias 113 as shown in FIG. 19B.

Figure 20:
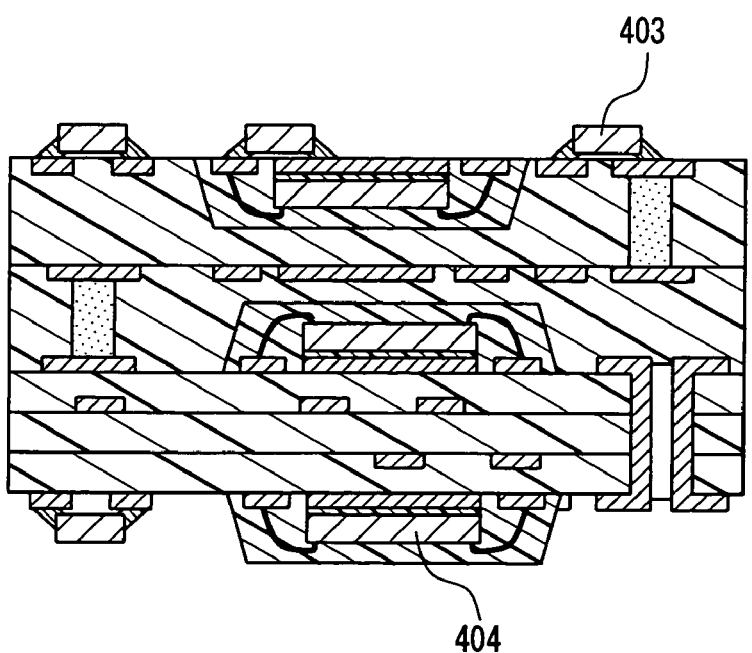
FIG. 20 is a cross-sectional view of another circuit component built-in module in Example 4 of the present invention.

Moreover, circuit components may be mounted on the wiring patterns 102, 103 or the supporting bases 401, 112 by soldering or the like so as to achieve higher density mounting. FIG. 20 shows an example of this configuration. In FIG. 20, chip components 403 and semiconductor chips 404 are mounted on the circuit component built-in module of the present invention.

Example 5

In Example 5, an example of manufacturing processes of the circuit component built-in module in Examples 1 and 3 will be described. The materials and circuit components used in Example 5 are the same as those in Example 4. FIGS. 21A to 21G are cross-sectional views showing an example of the manufacturing processes of the circuit component built-in module.

FIGS. 21A and 21B are the same as FIGS. 16A and 16B, respectively.

In FIG. 21C, a through hole formed in the composite material 101 is filled with the conductive resin composition 412 in the same manner as Example 4, and a cavity 501 is formed at the same time.

Figure 22A:
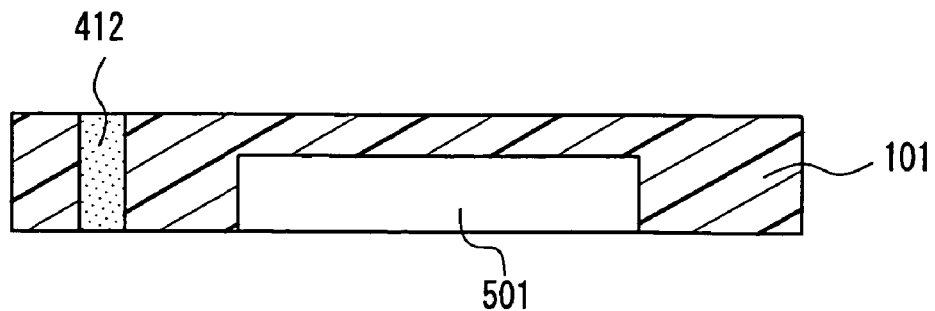
FIGS. 22A to 22D are cross-sectional views showing another manufacturing processes in Example 5 of the present invention.
Figure 22B:
Figure 22C:
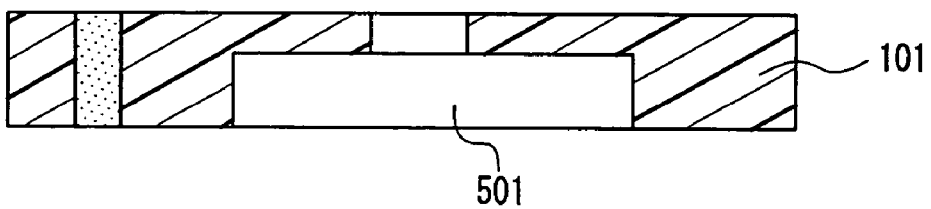
Figure 22D:
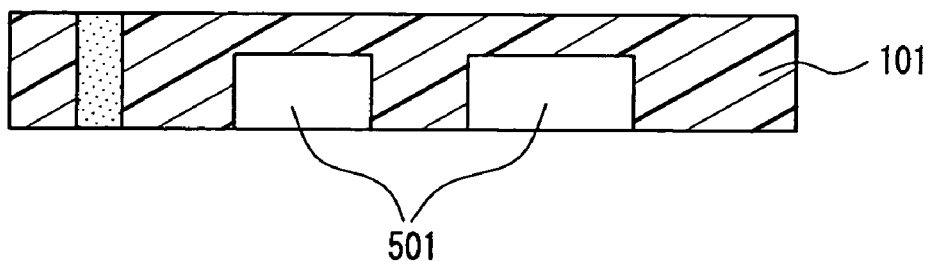

FIGS. 22A to 22D show an example of the shape of the cavity 501. In FIG. 22A, a cavity is formed in a portion of the composite material 101. In FIG. 22B, a cavity is formed through the composite material 101. In FIG. 22C, a cavity is formed in a two-step fashion. In FIG. 22D, a plurality of cavities are formed. Any of the cavities suitable for the shapes of the built-in circuit components can be used. In FIG. 21, the cavity is formed in accordance with the semiconductor chip 105. When additional circuit components are provided, it is also possible to form cavities for those circuit components.

The cavity 105 need not be the same as the circuit components or the sealant 109 in size and shape, and may have a desired shape depending on the flowability of the resin and the positions of the vias 104.

FIGS. 23A to 23B and 24A to 24C show an example of a method for forming the cavity 501. In FIG. 23A, a plurality of composite materials 101 having a through hole filled with the conductive resin composition 412 and a cavity may be prepared. Then, the composite materials 101 are superimposed to form the cavity 501 as shown in FIG. 23B. In FIG. 24A, a plurality of composite materials 101 having a cavity may be prepared. Then, the composite materials 101 are superimposed and formed into a desired shape as shown in FIG. 24B. Thereafter, a through hole is provided and filled with the conductive resin composition 412 as shown in FIG. 24C. The through-type cavity can be formed easily by punching or laser beam machining. Therefore, when a cavity is formed in a portion of the composite material 101 as shown in FIGS. 22A and 22D, it is preferable that the composite materials 101 are superimposed after forming the through-type cavity.

The processes in FIGS. 21D1, 21D2, and 21E are the same as those in Example 4.

In FIG. 21F, the composite material 101 with the cavity 501 that has been formed by the above method, the supporting base 112 on which the semiconductor chip 105 is mounted, and the supporting base 401 are aligned and superimposed over one another.

As shown in FIG. 21G, the layered material is heated and pressed by using a press in the same manner as Example 4, and the semiconductor chip 105 is embedded in the composite material 101 to form an integrated sheet body.

In this example, the composite material 101 having the cavity 501 is processed into a sheet body, so that the module can contain a large component. When such a large component is contained without using a cavity, the resin of the composite material 101 flows significantly and may cause the vias 104 to be displaced from a desired position.

The above manufacturing method can provide a circuit component built-in module of the present invention.

Example 6

In Example 6, an example of manufacturing processes of the circuit component built-in module in Examples 2 and 3 will be described. The materials and circuit components used in Example 6 are the same as those in Example 4. However, the connection terminals of the semiconductor chip 105 are located on its periphery. FIGS. 25A to 25G are cross-sectional views showing an example of the manufacturing processes of the circuit component built-in module.

FIGS. 25A, 25B, 25C, and 25D1 are the same as FIGS. 21A, 21B, 21C, and 21D1, respectively. In FIG. 25D2, the semiconductor chip 105 mounted as shown in FIG. 25D1 is molded by the sealant 109. In this case, the sealant 109 is not arranged in the central portion of the semiconductor chip 105. Instead, as shown in FIG. 25D3, the high thermal conductive sealant 201 is arranged in the central portion of the semiconductor chip 105. The high thermal conductive sealant 201 may be applied by a dispensing or screen printing method. After application, the high thermal conductive sealant 201 is cured by hot air or infrared radiation. Light such as ultraviolet radiation also can be used. When the high thermal conductive sealant 201 is cured at the same time as the sealant 109, productivity can be improved. It is preferable that the high thermal conductive sealant 201 is semi-cured rather than completely cured. This is because the adhesion between the high thermal conductive sealant 201 and the composite material 101 or the sealant 109 can be improved by curing them together in the subsequent heating and pressing process as shown in FIG. 25G.

Then, a sheet body in FIG. 25G can be provided in the same manner as Example 5. With this sheet body, a circuit component built-in module can be achieved as shown in FIG. 6.

When the cavity 501 in FIG. 25C has a shape as shown in FIG. 22C, a circuit component built-in module can be achieved as shown in FIG. 7.

Figure 26:
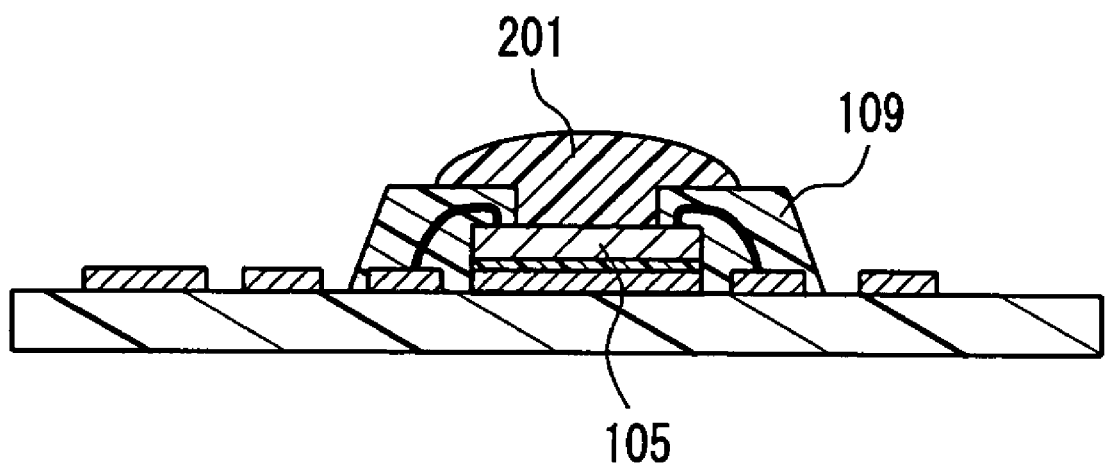
FIG. 26 is a cross-sectional view of a circuit component built-in module in Example 6 of the present invention.

When the cavity 501 in FIG. 25C has a shape as shown in FIG. 22B, and the high thermal conductive sealant 201 is arranged not only in the central portion of the semiconductor chip 105, but also on the sealant 109 as shown in FIG. 26, a circuit component built-in module can be achieved as shown in FIG. 8. The following is an explanation of a process of forming thermal vias (FIGS. 9 and 10) that further improve heat dissipation of the semiconductor chip 105.

The cavity 501 in FIG. 25C is formed into a shape as shown in FIG. 22C, and the high thermal conductive sealant 201 including the thermal vias 113 is prepared as shown in FIG. 27A. Then, the high thermal conductive sealant 201 is arranged in the central portion of the semiconductor chip 105 formed on the supporting base 112 as shown in FIG. 27B, which corresponds to FIG. 25D2. Thus, a sheet body in FIG. 25G can be provided in the same manner as Example 5. With this sheet body, a circuit component built-in module having the thermal vias 113 can be achieved as shown in FIG. 9.

The cavity 501 in FIG. 25C is formed into a shape as shown in FIG. 22B, and the supporting base is prepared as shown in FIG. 27C, which corresponds to FIG. 25D3. Thus, a sheet body in FIG. 25G can be provided in the same manner as Example 5. With this sheet body, a circuit component built-in module having the thermal vias 113 can be achieved as shown in FIG. 10.

Moreover, when the composite material 101 includes the thermal vias 113 as shown in FIG. 28A, which corresponds to FIG. 25C, a circuit component built-in module 100 can be achieved as shown in FIG. 28B.

In the circuit component built-in module of Example 6, the connection terminals of the semiconductor chip, the wiring pattern, and the wires are sealed. Therefore, even if the high thermal conductive sealant is a conductive material, the circuit structure does not suffer damage such as a short circuit. To improve heat dissipation of the semiconductor chip, the high thermal conductive sealant preferably includes a thermal conductive filler. The thermal conductive filler can provide high heat dissipation. Moreover, grounding can be enhanced by arranging the ground planes of the circuit components and the ground terminals of the wiring patterns.

It is further preferable that the thermal conductive filler is particles including at least one selected from $Al_2O_3$, BN, and AlN. These particles have low electric resistance and high heat conductivity.

The above manufacturing method can provide a circuit component built-in module of the present invention.

Example 7

In Example 7, an example of manufacturing processes of the circuit component built-in module in Examples 1 to 3 will be described. The materials and circuit components used in Example 7 are the same as those in Example 4. FIGS. 29A to 29H are cross-sectional views showing an example of the manufacturing processes of the circuit component built-in module.

Example 7 differs from Examples 4 to 6 in that the sealant 109 is applied (FIG. 29G) after the composite material 101 that includes the conductive resin composition 412 and the cavity 501 is stacked on the supporting base 112 on which the semiconductor chip is mounted (FIG. 29F). By applying the sealant 109 after the process in FIG. 29F, it can fill in the cavity 501 tightly (FIG. 29H). When the composite material 101 is heated and pressed, the composite material 101 flows into the cavity 501 (FIG. 29H). If the cavity 501 is too large, the cavity 501 has voids. To prevent such voids, it is preferable that the height of the cavity 501 (FIG. 29G) is narrower than 0.3 mm.

Figure 30:
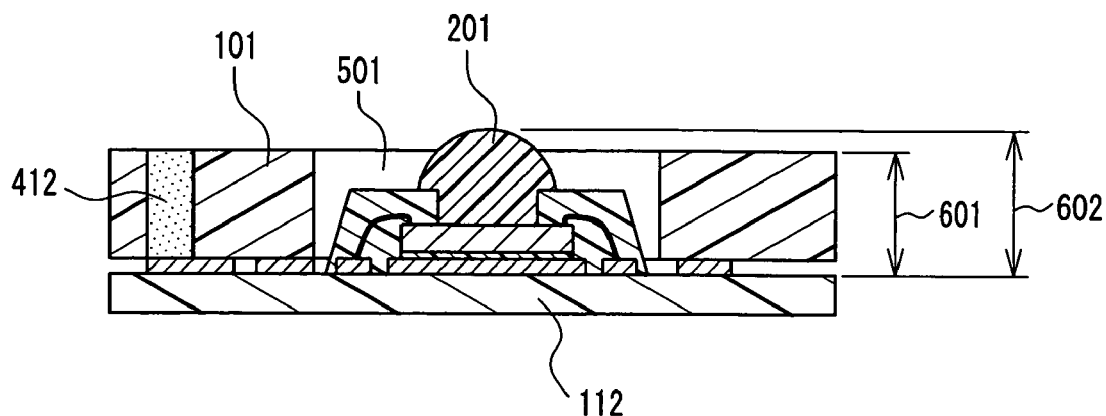
FIG. 30 is a cross-sectional view showing another manufacturing process in Example 7 of the present invention.

The high thermal conductive sealant 201 may be used in FIG. 29G. In this case, it is preferable that a second thickness 602 is larger than a first thickness 601, as shown in FIG. 30. The first thickness 601 is a distance from the upper surface of the composite material 101 to the upper surface of the supporting base 112. The second thickness 602 is a distance from the top of the high thermal conductive sealant 201 to the upper surface of the supporting base 112. With this configuration, the high thermal conductive sealant 201 is pressed before the composite material 101 in the sheet body formation process. Therefore, the high thermal conductive sealant 201 extends horizontally, while the flow of the resin of the composite material 101 is reduced. Thus, it is possible to suppress deformation of the conductive resin composition 412 that is provided in the composite material 101. Moreover, when the high thermal conductive sealant 201 extends horizontally, the contact area between the high thermal conductive sealant 201 and the supporting base 401 and the wiring pattern 103 is increased, thereby achieving a circuit component built-in module with improved heat dissipation as shown in FIG. 8.

Figure 31:
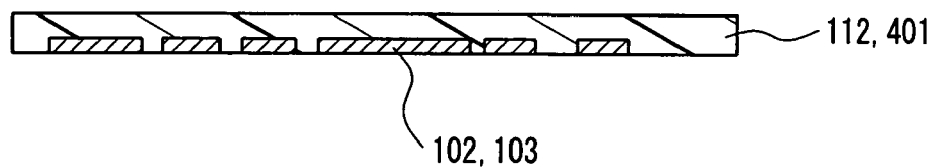
FIG. 31 is a cross-sectional view showing another manufacturing process in Example 7 of the present invention.

In Examples 1 to 7, the wiring patterns 102, 103 formed on the supporting bases 112, 401 may be embedded in the respective supporting bases, as shown in FIG. 31.

Example 8

Figure 34:
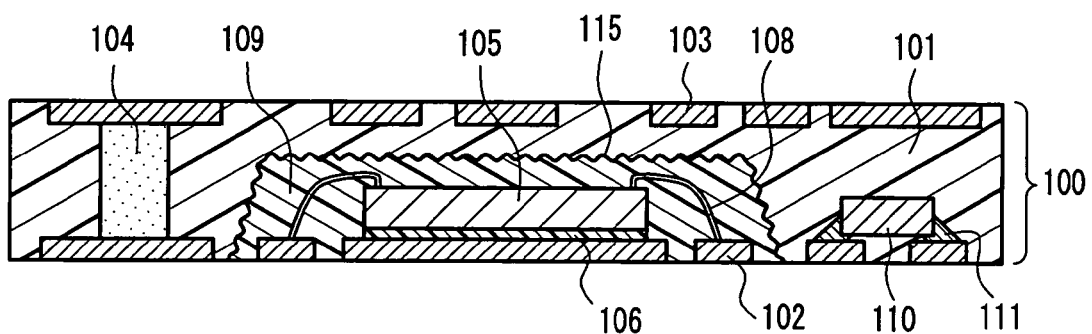
FIG. 34 is a cross-sectional view of a circuit component built-in module in Example 8 of the present invention.

Using the circuit component built-in module in FIG. 1, an example of improving the adhesion of the interface between the sealant 109 (the second mixture) and the sealant 101 (the first mixture) will be described. As shown in FIG. 34, the surface of the sealant 109 is roughened. The roughening may be performed physically by buffing or sandblasting. In this case, sandblasting is preferred because buffing may damage the wires. The surface also can be roughened chemically. Alternatively, the shape of a molding die with a predetermined surface roughness may be transcribed to the surface. This transcription is performed, e.g., by applying the sealant 109 to the wires, pressing a heated molding die on the surface of the sealant 109, transcribing the surface shape of the molding die to the surface of the sealant 109, and removing the molding die. It is preferable that the surface of the sealant 109 has a ten-point roughness (Rz) of 0.1 µm to 4 µm. The sealant 109 with roughness of this range can be bonded more firmly to the sealant 101. The ten-point roughness (Rz) is an average height difference between the five highest peaks and the five lowest valleys over the evaluation length of a profile curve, expressed in µm (JIS standards, B 0601).

Figure 35:
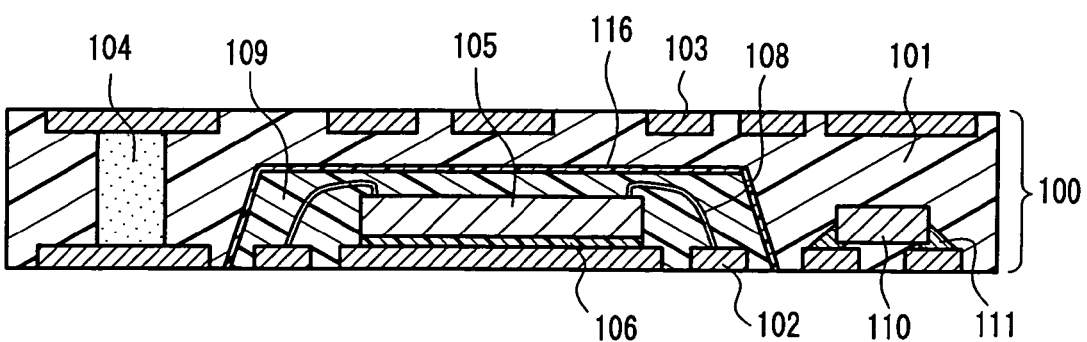
FIG. 35 is a cross-sectional view of another circuit component built-in module in Example 8 of the present invention.

Alternatively, a coupling agent may be applied to the surface of the sealant 109, as shown in FIG. 35. Examples of the coupling agent include a silane coupling agent and a titanium coupling agent. In particular, a silane coupling agent of γ-methacryloxpropyl trimethoxy silane may be used. The amount applied can be determined arbitrarily.

In this manner, it is possible to improve the adhesion of the interface between the sealant 109 (the second mixture) and the sealant 101 (the first mixture).

Example 9

Figure 36A:
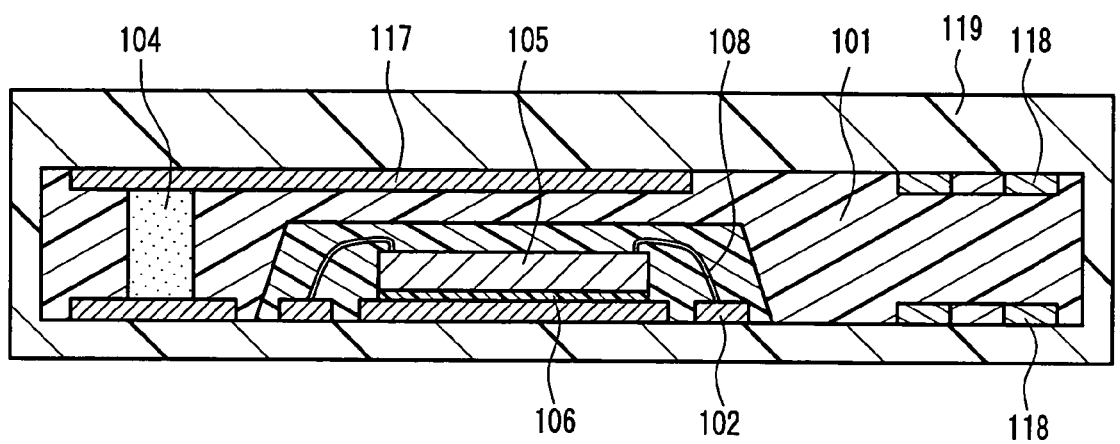
FIGS. 36A and 36B are cross-sectional views of a circuit component built-in module in Example 9 of the present invention when it is applied to an IC card.
Figure 36B:
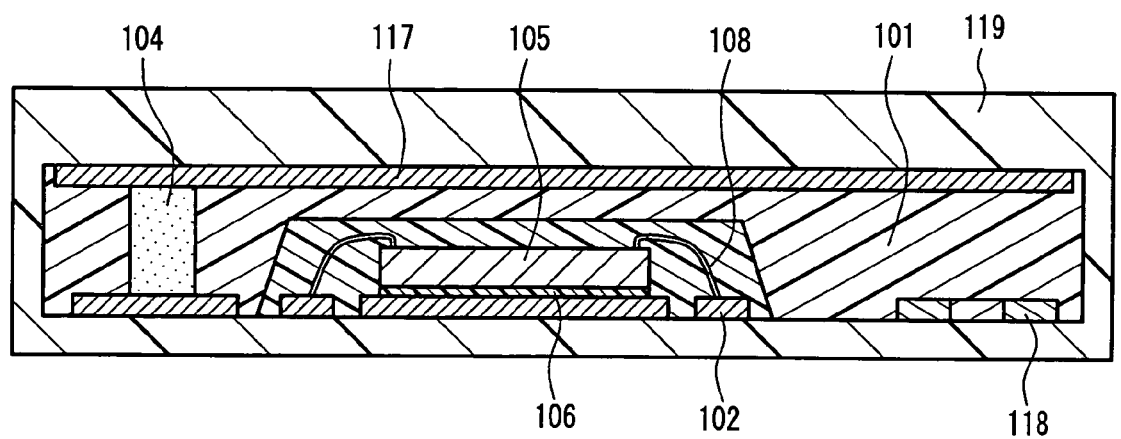

In this example, a circuit component built-in module of the present invention is mounted on an IC card (SIMPACT CARD), as shown in FIGS. 36A and 36B. A shield 117 is formed on the surface opposed to the wires 108 so as to prevent the wires 108 from functioning-as an antenna. An antenna circuit 118 is formed on the side of the semiconductor chip 105 and spaced apart. The antenna circuit 118 may be arranged in either two layers (FIG. 36A) or a single layer (FIG. 36B). In FIG. 36B, signals can be received/transmitted only in one direction. In this SIMPACT CARD, two layers of circuits sandwiching a semiconductor can be formed and connected electrically by a via. The whole of the IC card is covered with a card package resin 119.

Figure 37:
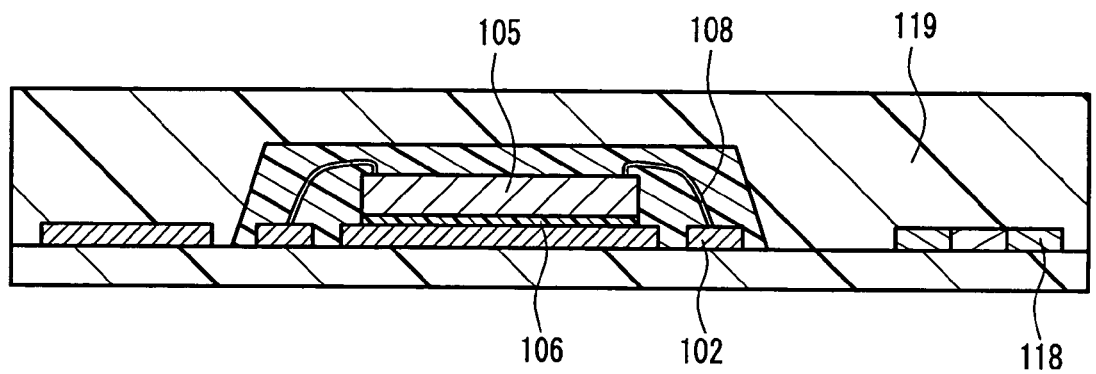
FIG. 37 is a cross-sectional view of a conventional IC card.
Figure 38:
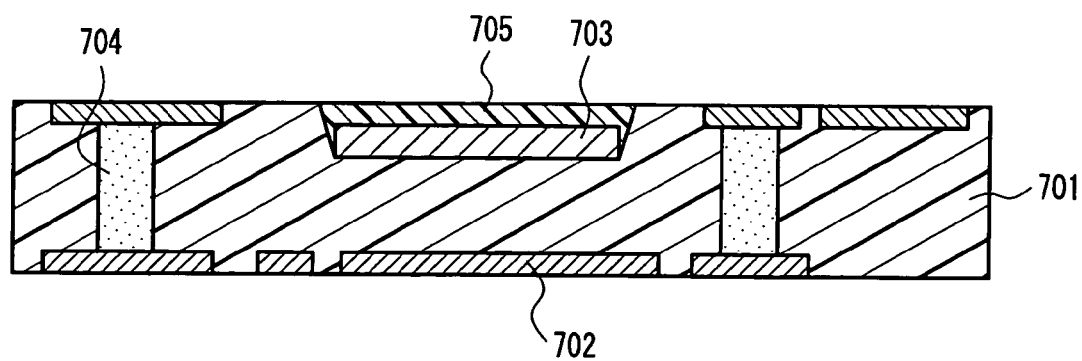
FIG. 38 is a cross-sectional view of a conventional semiconductor built-in module.

FIG. 37 shows a conventional card for reference. In FIG. 37, an antenna circuit 118 is formed on the side of a semiconductor chip 105 and spaced apart. The antenna circuit 118 is arranged in a single layer. The whole of the card is covered with a card package resin 119. However, wires 108 may pick up noise of signals and lead to malfunction of the semiconductor chip 105. Moreover, the antenna circuit 118 is formed as a single layer, so that the receiving sensitivity and transmission intensity are limited.

In contrast, the IC card of this example can prevent the effect of noise by the shield 117 and improve the limitation on the receiving sensitivity and transmission intensity by forming the antenna circuit 118 in two layers, as shown in FIG. 36A.

As described above, the present invention can provide a circuit component built-in module that uses a low cost mounting technique such as wire bonding and also can eliminate a wire failure or short circuit, and a method for manufacturing the circuit component built-in module. Moreover, the present invention also is useful for a package such as a heating power module.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit component built-in module comprising:
an electrical insulating substrate made of a first mixture including a filler and a thermosetting resin;
a wiring pattern formed on at least a principal surface of the electrical insulating substrate;
circuit components that are arranged inside the electrical insulating substrate and connected electrically to the wiring pattern; and
vias for electrically connecting the wiring patterns,
wherein at least one of the circuit components is an electronic component that is mounted using wires, and
part or all of the wires is sealed with a second mixture including a filler and a resin,
wherein a filler content of the second mixture is larger than that of the first mixture.

2. The circuit component built-in module according to claim 1, wherein at least one of the vias is filled with a composition that includes a conductive filler and a resin.

3. The circuit component built-in module according to claim 1, wherein the electronic component is mounted using wires and connected by wire bonding.

4. The circuit component built-in module according to claim 1, further comprising a third mixture including a filler and a resin,
wherein a central portion of the electronic component is sealed with the third mixture.

5. The circuit component built-in module according to claim 4, wherein thermal vias are formed in the first mixture or the third mixture.

6. The circuit component built-in module according to claim 4, wherein the filler of the third mixture includes a thermal conductive filler.

7. The circuit component built-in module according to claim 1, wherein the filler of the first mixture includes a hollow filler.

8. The circuit component built-in module according to claim 1, wherein the thermosetting resin of the first mixture includes at least one thermosetting resin selected from the group consisting of an epoxy resin, a phenol resin, and a cyanate resin.

9. The circuit component built-in module according to claim 1, wherein the filler of the first mixture and the second mixture includes at least one inorganic filler selected from the group consisting of $Al_2O_3$, MgO, BN, AlN, and $SiO_2$.

10. The circuit component built-in module according to claim 9, wherein the filler has an average particle size of 0.1 µm to 100 µm.

11. The circuit component built-in module according to claim 1, wherein a filler content of the first mixture is in a range of 70 wt % to 95 wt %.

12. The circuit component built-in module according to claim 1, wherein a filler content of the second mixture is in a range of 80 wt % to 95 wt %.

13. The circuit component built-in module according to claim 4, wherein a filler content of the third mixture is in a range of 84 wt % to 95 wt %.

14. The circuit component built-in module according to claim 4, wherein the filler of the third mixture has an average particle size of 0.1 µm to 50 µm.

15. The circuit component built-in module according to claim 2, wherein the conductive filler of the vias is metal particles or metal alloy particles that include at least one metal selected from the group consisting of gold, silver, copper, nickel, lead, tin, and aluminum.

16. The circuit component built-in module according to claim 1, wherein the second mixture seals the wires and the circuit component and the wiring pattern that are connected by the wires.

17. The circuit component built-in module according to claim 1, wherein at least a portion of a surface of a sealant made of the second mixture that forms an interface with a sealant made of the first mixture is roughened or provided with a pre-treated film.

18. The circuit component built-in module according to claim 1, wherein the electronic component is a semiconductor chip,
a shield is arranged on a surface of the semiconductor chip that is opposite to the wires,
at least one antenna circuit is formed on a side of the semiconductor chip and spaced apart, and
a whole of the module is covered with a card package resin.

* * * * *

UNITED STATES PATENT AND TRADEMARK OFFICE
CERTIFICATE OF CORRECTION

PATENT NO. : 7,180,169 B2
APPLICATION NO. : 10/926879
DATED : February 20, 2007
INVENTOR(S) : Ishimaru et al.

It is certified that error appears in the above-identified patent and that said Letters Patent is hereby corrected as shown below:

Column 18, line 15(claim 13): "84 wt %" should read --85 wt %--.

Signed and Sealed this

Sixth Day of November, 2007

JON W. DUDAS
*Director of the United States Patent and Trademark Office*